US012105153B2

(12) United States Patent
Ohata et al.

(10) Patent No.: US 12,105,153 B2
(45) Date of Patent: Oct. 1, 2024

(54) SYSTEM AND METHOD FOR BATTERY MANAGEMENT

(71) Applicant: DENSO CORPORATION, Kariya (JP)

(72) Inventors: Takuya Ohata, Kariya (JP); Shogo Shigemori, Kariya (JP); Tatsuhiro Numata, Kariya (JP); Tetsuya Watanabe, Kariya (JP); Masaki Uchiyama, Kariya (JP); Taisuke Kurachi, Kariya (JP)

(73) Assignee: DENSO CORPORATION, Kariya (JP)

( * ) Notice: Subject to any disclaimer, the term of this patent is extended or adjusted under 35 U.S.C. 154(b) by 77 days.

(21) Appl. No.: 17/896,179

(22) Filed: Aug. 26, 2022

(65) Prior Publication Data

US 2023/0062095 A1 Mar. 2, 2023

(30) Foreign Application Priority Data

Aug. 30, 2021 (JP) ................................ 2021-139723

(51) Int. Cl.
*G01R 31/3842* (2019.01)
*G01R 31/371* (2019.01)
*G01R 31/389* (2019.01)
*G01R 31/392* (2019.01)
*H02J 7/00* (2006.01)

(52) U.S. Cl.
CPC ....... *G01R 31/3842* (2019.01); *G01R 31/371* (2019.01); *G01R 31/389* (2019.01); *G01R 31/392* (2019.01); *H02J 7/00032* (2020.01); *H02J 7/0047* (2013.01)

(58) Field of Classification Search
None
See application file for complete search history.

(56) References Cited

U.S. PATENT DOCUMENTS 8,399,115 B2 3/2013 Ellwanger
2016/0056510 A1 2/2016 Takeuchi et al.
2016/0268642 A1 9/2016 Yamazoe et al.
(Continued)

OTHER PUBLICATIONS

U.S. Appl. No. 17/896,200, filed Aug. 26, 2022, Shigemori et al.
(Continued)

*Primary Examiner* — Jas A Sanghera
(74) *Attorney, Agent, or Firm* — Posz Law Group, PLC

(57) ABSTRACT

A battery management system includes a monitoring device and a controller. The monitoring device is arranged in a housing accommodating a battery, monitors the battery and acquires battery monitoring information that includes information indicating a state of the battery. The controller performs wireless communication with the monitoring device and execute a predetermined process based on the battery monitoring information. The controller transmits a request for battery monitoring information to the monitoring device. The monitoring device transmits the battery monitoring information to the controller in response to the request. The controller determines whether missing of the battery monitoring information has occurred based on a correlation between the battery monitoring information acquired from the monitoring device via wireless communication and relationship information held by the controller related to the battery monitoring information.

15 Claims, 15 Drawing Sheets

(56) References Cited

U.S. PATENT DOCUMENTS

| | | | | |
|---|---|---|---|---|
| 2018/0203072 | A1* | 7/2018 | Park | G01R 31/387 |
| 2019/0035237 | A1* | 1/2019 | Karner | F02N 11/0862 |
| 2020/0099111 | A1* | 3/2020 | Numata | H04Q 9/00 |

OTHER PUBLICATIONS

U.S. Appl. No. 17/896,217, filed Aug. 26, 2022, Shigemori et al.
U.S. Appl. No. 17/896,198, filed Aug. 26, 2022, Shigemori et al.
U.S. Appl. No. 17/896,417, filed Aug. 26, 2022, Ohata et al.
U.S. Appl. No. 17/896,261, filed Aug. 26, 2022, Nakagawa et al.
U.S. Appl. No. 17/896,186, filed Aug. 26, 2022, Moriya et al.
U.S. Appl. No. 17/896,239, filed Aug. 26, 2022, Shigemori et al.
U.S. Appl. No. 17/896,203, filed Aug. 26, 2022, Nakata et al.

* cited by examiner

SYSTEM AND METHOD FOR BATTERY MANAGEMENT

CROSS REFERENCE TO RELATED APPLICATION

The present application is based on and incorporates herein by reference Japanese Patent Application No. 2021-139723 filed on Aug. 30, 2021.

TECHNICAL FIELD

The present disclosure relates to a system and method for battery management.

BACKGROUND

A battery management system uses wireless communication.

SUMMARY

According to an aspect of the present disclosure, a battery management system includes at least one monitoring device and a controller. The at least one monitoring device is arranged in a housing accommodating a battery, monitors the battery and acquires battery monitoring information that includes information indicating a state of the battery. The controller performs wireless communication with the at least one monitoring device and execute a predetermined process based on the battery monitoring information. The controller transmits a request for battery monitoring information to the at least one monitoring device. The at least one monitoring device transmits the battery monitoring information to the controller in response to the request. The controller determines whether missing of the battery monitoring information has occurred based on a correlation between the battery monitoring information acquired from the at least one monitoring device via wireless communication and relationship information held by the controller related to the battery monitoring information.

BRIEF DESCRIPTION OF THE DRAWINGS

The details of one or more embodiments are set forth in the accompanying drawings and the description below. Other features and advantages will be apparent from the description and drawings, and from the claims.

DETAILED DESCRIPTION

Figure 1:
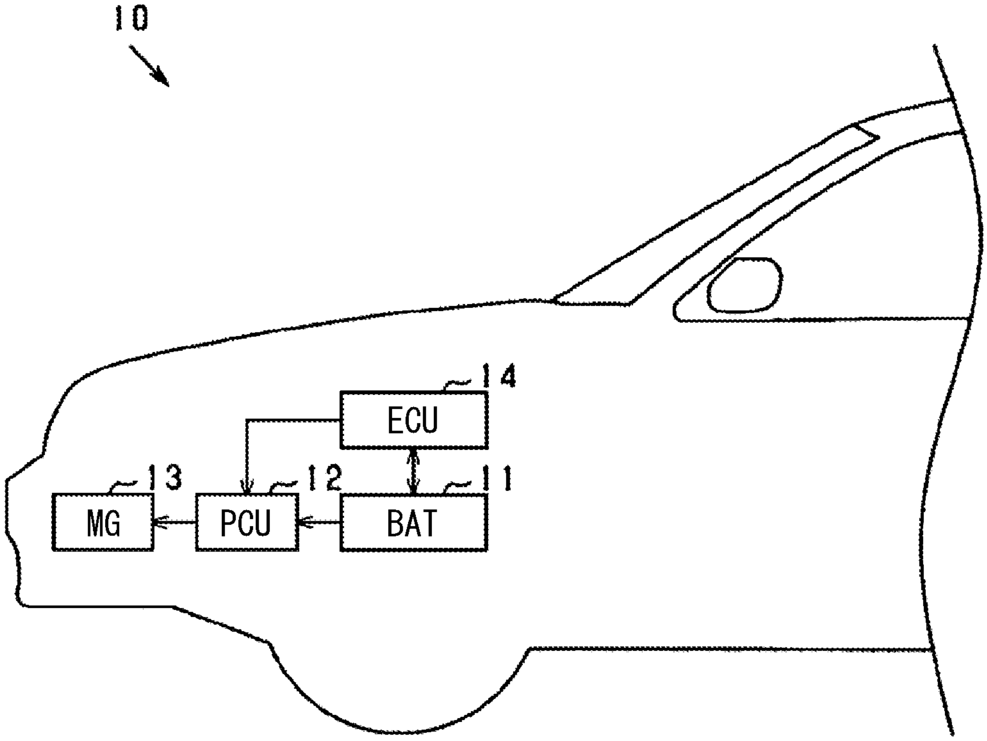
FIG. 1 is a diagram illustrating a vehicle including a battery pack.

To begin with, examples of relevant techniques will be described. A battery management system according to a comparative example uses wireless communication. The disclosure of the prior art literature (U.S. Pat. No. 8,399,115 B2) is incorporated herein by reference to explain technical elements presented herein.

In the battery management system using wireless communication, wireless communication is performed between a controller and a monitoring device that monitors a state of a battery. The controller acquires battery monitoring information from the monitoring device by the wireless communication and executes a predetermined process. In wireless communication, missing of battery monitoring information may occur due to deterioration of communication environment. However, the battery management system cannot detect the occurrence of missing. If a predetermined process is executed without detecting the missing, an accuracy of the process may be lowered, for example.

In contrast, according to the present disclosure, a system and method for battery management is capable of detecting missing of battery monitoring information.

According to an aspect of the present disclosure, a battery management system includes at least one monitoring device and a controller. The at least one monitoring device is arranged in a housing accommodating a battery, monitors the battery and acquires battery monitoring information that includes information indicating a state of the battery. The controller performs wireless communication with the at least one monitoring device and execute a predetermined process based on the battery monitoring information. The controller transmits a request for battery monitoring information to the at least one monitoring device. The at least one monitoring device transmits the battery monitoring information to the controller in response to the request. The controller determines whether missing of the battery monitoring information has occurred based on a correlation between the battery monitoring information acquired from the at least one monitoring device via wireless communication and relationship information held by the controller related to the battery monitoring information.

According to the battery management system, the controller holds information related to the battery monitoring information to be acquired. Thus, the controller is capable of determining whether missing of the battery monitoring information has occurred based on the correlation between the battery monitoring information acquired from the monitoring device via wireless communication and the relationship information. As a result, the battery management system is capable of detecting the missing of the battery monitoring information.

According to another aspect of the present disclosure, a method for managing a battery is disclosed. The battery is accommodated in a housing. In the method, wireless communication is performed between at least one monitoring device and a controller. The at least one monitoring device is arranged in the housing to monitor the battery and acquire battery monitoring information that includes information indicating a state of the battery. The controller executes a predetermined process based on the battery monitoring information. In the method, a request for battery monitoring information is transmitted by the controller to the at least one monitoring device. The battery monitoring information is transmitted by the at least one monitoring device to the controller in response to the request. It is determined by the controller whether missing of the battery monitoring information has occurred based on a correlation between the battery monitoring information acquired from the at least one monitoring device via wireless communication and relationship information held by the controller related to the battery monitoring information.

The battery management method utilizes information held by the controller and related to the battery monitoring information to be acquired. The controller is capable of determining whether missing of the battery monitoring information has occurred based on the correlation between the battery monitoring information acquired via wireless communication and the relationship information. As a result, the battery management method is capable of detecting the missing of the battery monitoring information.

Hereinafter, multiple embodiments will be described with reference to the drawings. The same or corresponding elements in the embodiments are assigned the same reference numerals, and descriptions thereof will not be repeated. When only a part of the configuration is described in one embodiment, the other parts of the configuration may employ descriptions about a corresponding configuration in another embodiment preceding the one embodiment. Further, not only the combinations of the configurations explicitly shown in the description of the respective embodiments, but also the configurations of multiple embodiments can be partially combined even when they are not explicitly shown as long as there is no difficulty in the combination in particular.

First Embodiment

First, a configuration of a vehicle on which a battery management system according to the present embodiment is mounted will be described with reference to FIG. 1. Particularly, a vehicle related to a battery pack including the battery management system will be described. FIG. 1 is a diagram illustrating a schematic configuration of the vehicle. The vehicle is an electric vehicle such as a battery electric vehicle (BEV), a hybrid electric vehicle (HEV), or a plug-in hybrid electric vehicle (PHEV). The battery management system can also be applied to a mobile body other than vehicles, and, for example, can be applied to a flying body like a drone, a ship, a construction machine, or an agricultural machine. The battery management system can also be applied to stationary batteries (storage batteries) for home use, business use, and the like.

<Vehicle>

As shown in FIG. 1, a vehicle 10 includes a battery pack (BAT) 11, a PCU 12, an MG 13, and an ECU 14. "PCU" is an abbreviation for "Power Control Unit". "MG" is an abbreviation of "Motor Generator". "ECU" is an abbreviation of "Electronic Control Unit".

The battery pack 11 includes an assembled battery 20 described later, and provides a chargeable and dischargeable DC voltage source. The battery pack 11 supplies electric power to an electric load of the vehicle 10. For example, the battery pack 11 supplies the electric power to the MG 13 through the PCU 12. The battery pack 11 is charged through the PCU 12. The battery pack 11 may be referred to as a main machine battery.

For example, as illustrated in FIG. 1, the battery pack 11 is disposed in a front compartment of the vehicle 10. The battery pack 11 may be disposed in a rear compartment, under a seat, under a floor, or the like. For example, in the case of a hybrid electric vehicle, a compartment in which an engine is disposed may be referred to as an engine compartment or an engine room.

A temperature of the battery pack 11 is adjusted by air flowing into the vehicle 10 running and cooling air supplied from a fan mounted on the vehicle 10. The temperature of the battery pack 11 may be adjusted by a cooling liquid circulating inside the vehicle 10. The temperature adjustment described above reduces an excessive temperature change of the battery pack 11. The battery pack 11 may be simply coupled to a member having a large heat capacity, such as a body of the vehicle 10, in a thermally conductive manner.

The PCU 12 executes bidirectional power conversion between the battery pack 11 and the MG 13 according to a control signal from the ECU 14. The PCU 12 may be referred to as a power converter. The PCU 12 can include an inverter and a converter. The converter is disposed in an energization path between the battery pack 11 and the inverter. The converter has a function of raising and lowering the DC voltage. The inverter converts the DC voltage raised by the converter into an AC voltage such as a three-phase AC voltage, and outputs the AC voltage to the MG 13. The inverter converts the generated power of the MG 13 into a DC voltage and outputs the DC voltage to the converter.

The MG 13 is an AC rotating machine such as a three-phase AC synchronous motor in which a permanent magnet is embedded in a rotor. The MG 13 functions as a drive source for running of the vehicle 10, that is, an electric motor. The MG 13 is driven by the PCU 12 to generate a rotational driving force. The driving force generated by the MG 13 is transmitted to a drive wheel. The MG 13 functions as a generator at the time of braking of the vehicle 10 and performs regenerative power generation. The generated power of the MG 13 is supplied to the battery pack 11 through the PCU 12 and stored in the assembled battery 20 inside the battery pack 11.

The ECU 14 includes a computer including a processor, a memory, an input/output interface, a bus that connects these components. The processor is hardware for arithmetic processing. The processor includes, for example, a CPU as a core. "CPU" is an abbreviation for "Central Processing Unit". The memory is a non-transitory tangible storage medium that non-transiently stores computer-readable programs, data, and the like. The memory stores various programs to be executed by the processor.

The ECU 14 acquires information regarding the assembled battery 20 from the battery pack 11, for example, and controls the PCU 12 to control driving of the MG 13 and charging and discharging of the battery pack 11. The ECU 14 may acquire information such as a voltage, a temperature, a current, an SOC, and an SOH of the assembled battery 20 from the battery pack 11. The ECU 14 may acquire battery information such as a voltage, a temperature, and a current of the assembled battery 20 and calculate an SOC and an SOH. “SOC” is an abbreviation for “State Of Charge”. “SOH” is an abbreviation for “State Of Health”.

The processor of the ECU 14 executes, for example, multiple instructions included in a PCU control program stored in the memory. As a result, the ECU 14 constructs multiple functional units for controlling the PCU 12. As described above, in the ECU 14, the program stored in the memory causes the processor to execute the multiple instructions, thereby constructing the functional units. The ECU 14 may be referred to as an EVECU.

<Battery Pack>

Figure 2:
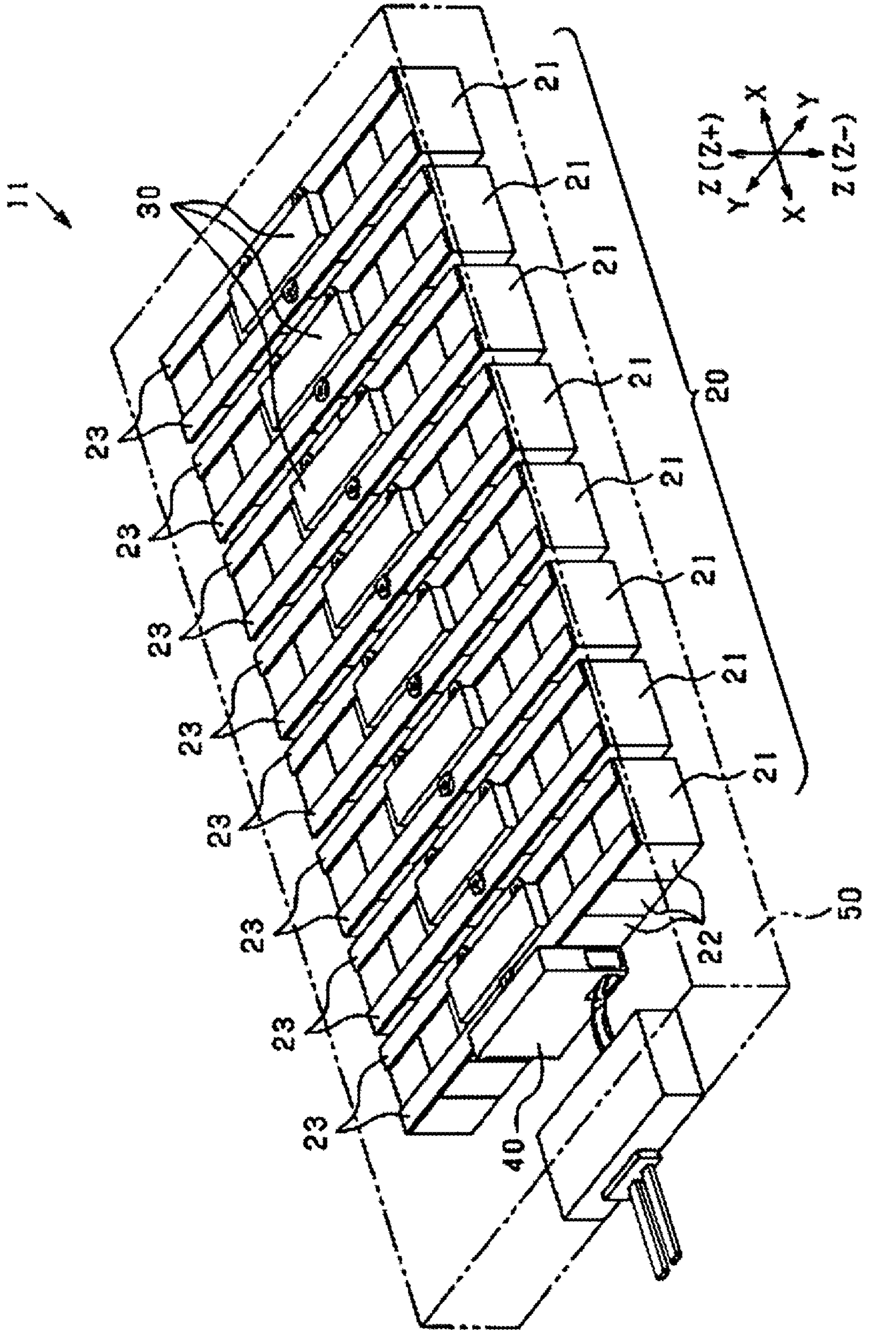
FIG. 2 is a perspective view illustrating a schematic configuration of the battery pack.
Figure 3:
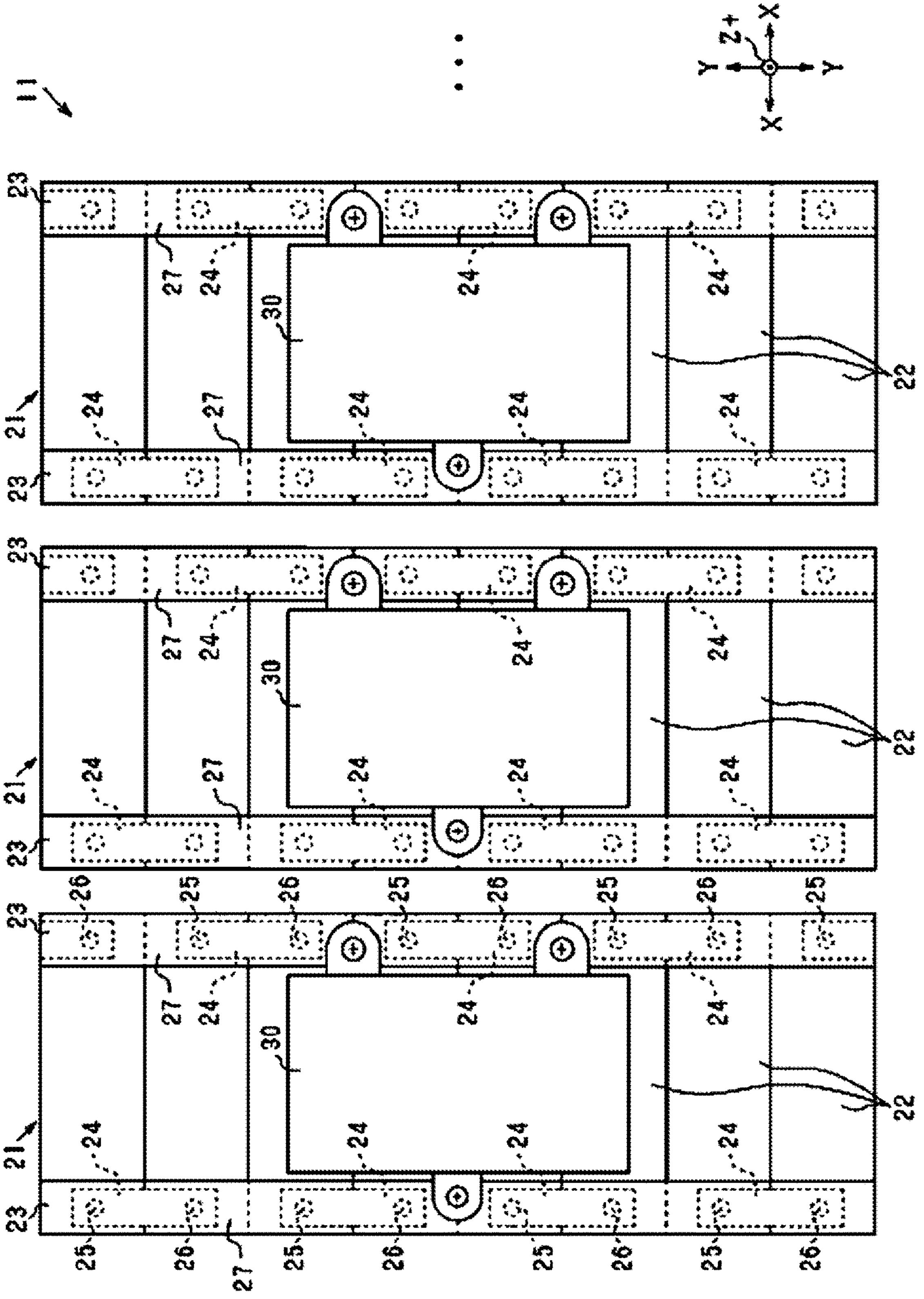
FIG. 3 is a top view illustrating an assembled battery.

Next, an example of a configuration of the battery pack 11 will be described with reference to FIGS. 2 and 3. FIG. 2 is a perspective view schematically illustrating an inside of the battery pack 11. In FIG. 2, a housing 50 is indicated by a two-dot chain line. FIG. 3 is a top view illustrating an upper surface of each battery stack.

As illustrated in FIG. 2, the battery pack 11 includes the assembled battery 20, monitoring devices 30, a controller 40, and the housing 50. Hereinafter, as illustrated in FIG. 2, a longitudinal direction is referred to as an X direction, and a lateral direction is referred to as a Y direction, on a mounting surface of the housing 50 attached to the vehicle 10 that is one of surfaces of the housing 50 having a substantially rectangular parallelepiped shape. In FIG. 2, a lower surface of the housing 50 is the mounting surface. An up-down direction perpendicular to the mounting surface is referred to as a Z direction. The X direction, the Y direction, and the Z direction are arranged to be orthogonal to each other. In the present embodiment, a right-left direction of the vehicle 10 corresponds to the X direction, a front-rear direction of the vehicle 10 corresponds to the Y direction, and the up-down direction of the vehicle 10 corresponds to the Z direction. The arrangement of FIGS. 2 and 3 is merely an example, and the battery pack 11 may be arranged in any manner relative to the vehicle 10.

The assembled battery 20 includes battery stacks 21 arranged side by side in the X direction. The battery stacks 21 may be referred to as battery blocks, battery modules, or the like. The assembled battery 20 is formed by the battery stacks 21 connected in series and/or in parallel. In the present embodiment, the battery stacks 21 are connected in series.

Each battery stack 21 has battery cells 22. The battery cells 22 are accommodated in a case. As a result, the relative positions of the battery cells 22 are fixed. The case is made of metal or resin. When the case is made of metal, an electrically insulating member may be partially or entirely interposed between a wall surface of the case and the battery cells 22.

The form of the fixing member is not particularly limited as long as the relative positions of the battery cells 22 can be fixed. For example, a configuration in which the battery cells 22 are restrained by a band having a strip shape can be adopted. In this case, a separator for keeping a separation distance between the battery cells 22 may be interposed between the battery cells 22.

Each battery stack 21 includes the battery cells 22 connected in series. In the battery stack 21 of the present embodiment, the battery cells 22 arranged side by side in the Y direction are connected in series. The assembled battery 20 provides the above-described DC voltage source. The assembled battery 20, the battery stacks 21, and the battery cells 22 correspond to a battery.

Each battery cell 22 is a secondary battery that generates an electromotive voltage by a chemical reaction. A lithium ion secondary battery, a nickel-metal hydride secondary battery, an organic radical battery, or the like can be adopted as the secondary battery. The lithium ion secondary battery is a secondary battery using lithium as a charge carrier. The secondary battery that can be adopted as the battery cell 22 may be not only a secondary battery in which the electrolyte is a liquid but also a so-called all-solid-state battery using a solid electrolyte.

The battery cell 22 includes a power generating element and a battery case that accommodates the power generating element. As illustrated in FIG. 3, the battery case of each battery cell 22 is formed in a flat shape. The battery case has two end surfaces facing in the Z direction, and having a total of four lateral surfaces including two lateral surfaces facing in the X direction and two lateral surfaces facing in the Y direction. The battery case of the present embodiment is made of metal.

The battery cells 22 are stacked such that lateral surfaces of the battery cases are in contact with each other in the Y direction. Each battery cell 22 has a positive electrode terminal 25 and a negative electrode terminal 26 at different ends in the X direction. The positive electrode terminal 25 and the negative electrode terminal 26 protrude in the Z direction, more specifically, a Z+ direction that is an upward direction. The positions of the end surfaces from which the positive electrode terminal 25 and the negative electrode terminal 26 protrude are the same in the Z direction for each battery cell 22. The battery cells 22 are stacked such that the positive electrode terminals 25 and the negative electrode terminals 26 are alternately arranged in the Y direction.

Linear bus bar units 23 are disposed at both ends of an upper surface of each battery stack 21 in the X direction. The bus bar units 23 are disposed on both ends, in the X direction, of the end surfaces of the battery cases from which the positive electrode terminal 25 and the negative electrode terminal 26 protrude. That is, a pair of bus bar units 23 are disposed in each battery stack 21.

Each bus bar unit 23 includes bus bars 24 electrically connecting the positive electrode terminals 25 and the negative electrode terminals 26 alternately arranged in the Y direction, and a bus bar cover 27 covering the bus bars 24. Each bus bar 24 is a plate material made of a metal having good conductivity such as copper or aluminum. The bus bar 24 electrically connects the positive electrode terminal 25 and the negative electrode terminal 26 of the battery cells 22 adjacent to each other in the Y direction. As a result, in each battery stack 21, the battery cells 22 are connected in series.

According to such a connection structure, in each battery stack 21, one of two battery cells 22 located at the opposite ends of the battery cells 22 arranged in the Y direction has the highest potential, and the other has the lowest potential. A predetermined wire is connected to at least one of the positive electrode terminal 25 of the battery cell 22 having the highest potential and the negative electrode terminal 26 of the battery cell 22 having the lowest potential.

As illustrated in FIG. 2, the battery stacks 21 are arranged in the X direction. The positive electrode terminal 25 of the battery cell 22 having the highest potential in one of two battery stacks 21 adjacent to each other in the X direction is connected via a predetermined wire to the negative electrode terminal 26 of the battery cell 22 having the lowest potential in the other of the two battery stacks 21. Accordingly, the battery stacks 21 are connected in series.

According to such a connection structure, one of two battery stacks 21 located at the opposite ends of the battery stacks 21 arranged in the X direction becomes a highest potential battery stack 21, and the other becomes a lowest potential battery stack 21. An output terminal is connected to the positive electrode terminal 25 of the battery cell 22 having the highest potential among the battery cells 22 in the highest potential battery stack 21. An output terminal is connected to the negative electrode terminal 26 of the battery cell 22 having the lowest potential among the battery cells 22 in the lowest potential battery stack 21. These two output terminals are connected to an electric device mounted on the vehicle 10 such as the PCU 12.

Two battery stacks 21 adjacent to each other in the X direction may not be electrically connected via a predetermined wire. Any two of the battery stacks 21 arranged in the X direction may be electrically connected via a predetermined wire. The positive electrode terminal 25 and the negative electrode terminal 26 electrically connected via a predetermined wire may be same or different in position in the Y direction. That is, the positive electrode terminal 25 and the negative electrode terminal 26 may at least partially face each other or not face each other at all in the X direction. One of the positive electrode terminal 25 and the negative electrode terminal 26 may be at least partially located or be not located at all in a projected area obtained by projecting the other of the positive electrode terminal 25 and the negative electrode terminal 26 in the X direction.

Each bus bar cover 27 is formed of an electrically insulating material such as resin. The bus bar cover 27 is provided linearly from one end to the other end of the battery stack 21 along the Y direction such that the bus bar cover 27 cover the multiple bus bars 24. The bus bar cover 27 may have a partition wall. The partition wall enhances insulation between two bus bars 24 adjacent to each other in the Y direction.

The monitoring devices 30 are individually provided for the battery stacks 21. As shown in FIG. 2, a monitoring device 30 is arranged between the pair of bus bar units 23 on each of the battery stacks 21. The monitoring device 30 faces the end surface of the battery case in the Z direction, the positive electrode terminal 25 and the negative electrode terminal 26 protruding from the end surface. The monitoring device 30 and the end surface may be separated from each other in the Z direction or may face each other and be in contact with each other in the Z direction. An object such as an insulating sheet may be interposed between the monitoring device 30 and the end surface.

The monitoring device 30 is fixed to the bus bar units 23 with a screw or the like. As will be described later, the monitoring device 30 is capable of performing wireless communication with the controller 40. An antenna 37, which will be described later, included in the monitoring device 30 is disposed so as not to overlap with the bus bar units 23 in the Z direction, that is, so as to protrude more than the bus bar units 23 in the Z direction.

A material of a coupling member such as a screw for coupling the monitoring device 30 and the bus bar units 23 may be, for example, a nonmagnetic material in order to avoid interference with wireless communication. In addition to the screw, among parts provided in the battery stack 21, a part that does not particularly need to have magnetism can adopt a nonmagnetic material as its constituent material.

In the present embodiment, the monitoring devices 30 are arranged in the X direction. The monitoring devices 30 are the same in position in the Y direction. With the configuration described above, extension of the separation intervals of the monitoring devices 30 are reduced.

The controller 40 is attached to an outer side surface of a battery stack 21 disposed at one end in the X direction. The controller 40 is capable of performing wireless communication with each monitoring device 30. An antenna 42, which will be described later, included in the controller 40 is disposed at about the same height as the antenna 37 of the monitoring device 30 in the Z direction. That is, the antenna 42 of the controller 40 is provided so as to protrude more than the bus bar units 23 in the Z direction.

In the battery pack 11, the monitoring devices 30 and the controller 40 provide a battery management system 60 described later. That is, the battery pack 11 includes the battery management system 60.

In order to avoid the battery pack 11 from becoming an electromagnetic noise source, it may be necessary to reduce leakage of radio waves of wireless communication to the outside of a communication space where wireless communication between the monitoring device 30 and the controller 40 is performed. Conversely, in order to reduce interference of the wireless communication, it may be necessary to reduce entry of electromagnetic noise into the communication space.

For this reason, the housing 50 is capable of reflecting electromagnetic waves, for example. The housing 50 includes a material in order to reflect electromagnetic waves, described below as an example. For example, the housing 50 includes a magnetic material such as metal. The housing 50 includes a resin material and a magnetic material covering a surface of the resin material. The housing 50 includes a resin material and a magnetic material embedded in the resin material. The housing 50 includes carbon fibers. The housing 50 may be capable of absorbing electromagnetic waves instead of reflecting electromagnetic waves.

The housing 50 may have a hole communicating with an accommodation space inside the housing 50 and a space (external space) outside the housing 50. The hole is defined by a coupling surface that is between and connecting an inner surface and an outer surface of the housing 50. The hole is used for ventilation, extraction of a power line, and extraction of a signal line, for example. In the case of a configuration having a hole, a cover may be provided on the hole. The cover prevents communication between the accommodation space and the external space. The cover may block an entire or a part of the hole.

The cover is provided, for example, on either one of the inner surface, the outer surface, or the coupling surface of the housing 50. The cover may be disposed to face the hole so as to cover the hole, instead of being provided on either one of the inner surface, the outer surface, or the coupling surface. In a case where the cover and the hole are separated from each other, a separation gap therebetween is shorter than a length of the hole. The length of the hole is either a dimension between the inner surface and the outer surface, or a dimension in a direction orthogonal to the distance between the inner surface and the outer surface.

The cover is, for example, a connector, an electromagnetic shielding member, a sealing material, or the like. The cover includes a material described below as an example.

The cover includes, for example, a magnetic material such as metal. The cover includes a resin material and a magnetic material covering a surface of the resin material. The cover includes a resin material and a magnetic material embedded in the resin material. The cover includes carbon fibers. The cover includes a resin material.

The hole of the housing 50 may be covered with at least one of elements accommodated in the accommodation space of the housing 50. A separation gap between the accommodated element and the hole is shorter than the length of the hole described above. The power line and the signal line may be disposed across the accommodation space and the external space while being held by an electrically insulating member forming a part of a wall of the housing 50.

<Battery Management System>

Figure 4:
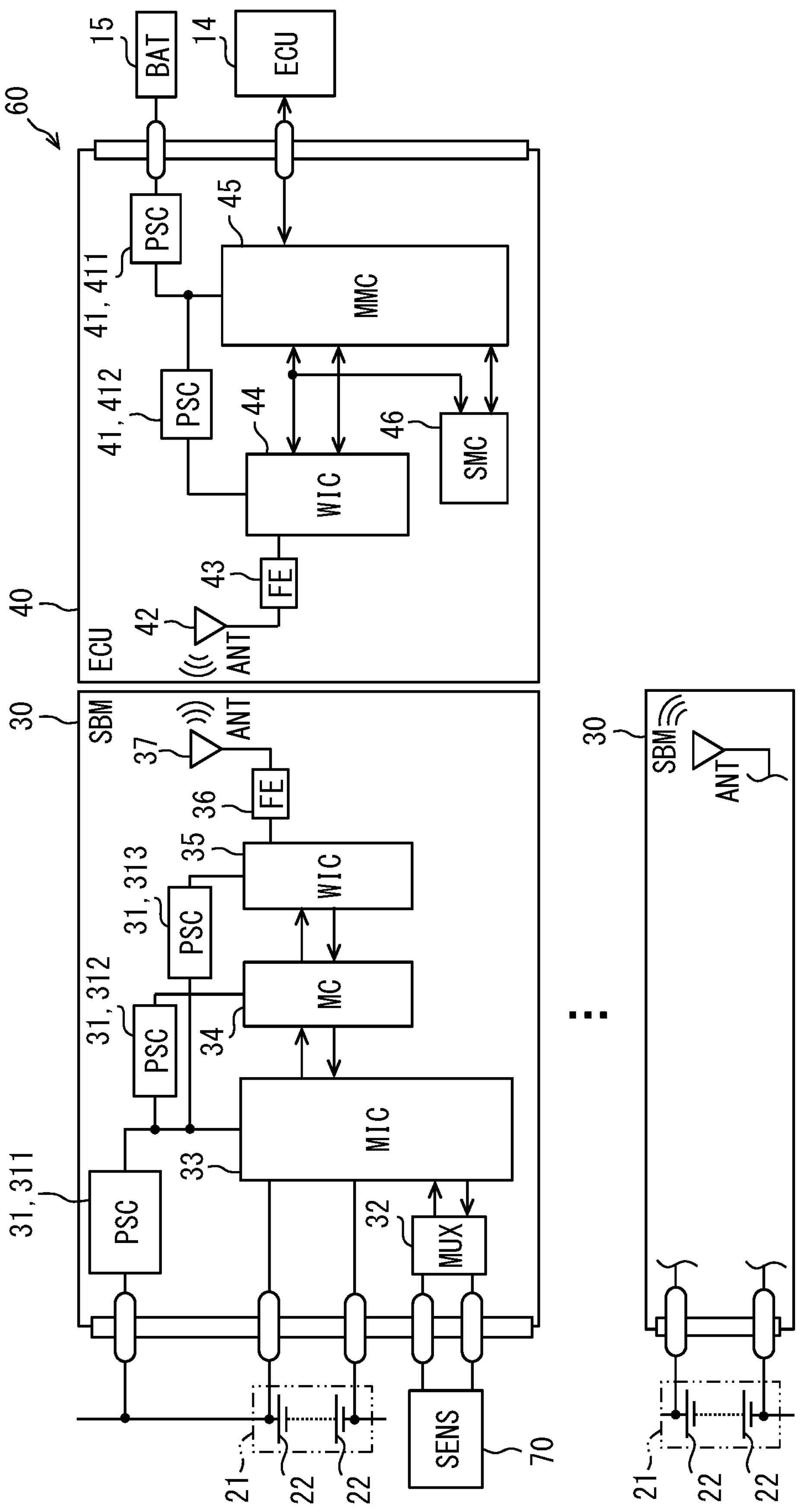
FIG. 4 is a block diagram showing a configuration of a battery management system according to a first embodiment.

Next, a schematic configuration of the battery management system will be described with reference to FIG. 4. FIG. 4 is a block diagram showing the configuration of the battery management system.

As shown in FIG. 4, the battery management system 60 includes the monitoring devices (SBMs) 30 and the controller (ECU) 40. In the following, a monitoring device may be referred to as SBM. The controller 40 may be referred to as a battery ECU or a BMU. BMU is an abbreviation for Battery Management Unit. The battery management system 60 is a system that manages batteries using wireless communication. This wireless communication uses a frequency band used in short-range communication, for example, a 2.4 GHz band or a 5 GHz band.

The battery management system 60 adopts one-to-one communication or network communication depending on the number of nodes of wireless communication performed by the monitoring devices 30 and/or the controller 40. The number of nodes may vary depending on resting states of the monitoring devices 30 and/or the controller 40. When the number of nodes is two, the battery management system 60 adopts one-to-one communication. When the number of nodes is 3 or more, the battery management system 60 adopts network communication. One example of network communication is star communication in which wireless communication is performed between one node as a master and the other nodes as slaves. Another example of network communication is chain communication in which multiple nodes are connected in series to perform wireless communication. Another example of network communication is mesh communication.

The battery management system 60 further includes a sensor 70. The sensor 70 includes a physical quantity detection sensor that detects a physical quantity of each battery cell 22, and a determination sensor. The physical quantity detection sensor includes a voltage sensor, a temperature sensor, and a current sensor, for example.

The voltage sensor includes a detection line coupled to a bus bar 24. The voltage sensor detects a voltage (cell voltage) of each of the battery cells 22. The determination sensor determines whether a correct battery is attached.

The temperature sensor is selectively provided in some of battery cells 22 included in a battery stack 21. The temperature sensor detects a temperature (cell temperature) of selected one of the battery cells 22 as a temperature of the battery stack 21. Among the battery cells 22 included in one battery stack 21, a battery cell 22 expected to have the highest temperature, a battery cell 22 expected to have the lowest temperature, a battery cell 22 expected to have an intermediate temperature are provided with the temperature sensor, for example. The number of temperature sensors for one battery stack 21 is not particularly limited.

The current sensor is provided in the battery stacks 21. The current sensor detects a current (cell current) commonly flowing through the battery cells 22 connected in series and the battery stacks 21 connected in series. In the present embodiment, one current sensor is provided because all the battery stacks 21 are connected in series. However, the number of current sensors is not limited to this example.

<Monitoring Device>

First, the monitoring devices 30 will be described. Each monitoring device 30 has a common configuration. The monitoring device 30 includes a power supply circuit (PSC) 31, a multiplexer (MUX) 32, a monitoring IC (MIC) 33, a microcontroller (MC) 34, a wireless IC (WIC) 35, a front end circuit (FE) 36, and the antenna (ANT) 37. Communication between elements within the monitoring device 30 is performed via wires.

The power supply circuit 31 uses a voltage supplied from the battery stacks 21 to generate operation power of other circuit elements included in the monitoring device 30. In the present embodiment, the power supply circuit 31 includes power supply circuits 311, 312, and 313. The power supply circuit 311 generates a predetermined voltage using the voltage supplied from the battery stacks 21 and supplies the generated voltage to the monitoring IC 33. The power supply circuit 312 generates a predetermined voltage using the voltage generated by the power supply circuit 311 and supplies the generated voltage to the microcontroller 34. The power supply circuit 313 generates a predetermined voltage using the voltage generated by the power supply circuit 311 and supplies the generated voltage to the wireless IC 35.

The multiplexer 32 is a selection circuit that selects one of detection signals of at least some of the sensors 70 included in the battery pack 11 and outputs the selected signal. The multiplexer 32 selects (switches) an input according to the selected signal from the monitoring IC 33 and outputs the input as one signal.

The monitoring IC 33 senses (acquires) battery information such as a cell voltage and a cell temperature, and transmits the battery information to the microcontroller 34. For example, the monitoring IC 33 acquires the cell voltage directly from the voltage sensor, and acquires information such as the cell temperature through the multiplexer 32. The monitoring IC 33 acquires the cell voltage and determines which battery cell 22 corresponds to the cell voltage. That is, the monitoring IC 33 acquires the cell voltage while performing cell determination. The cell current detected by the current sensor may be input to the monitoring IC 33 or may be input to the controller 40 by wired transmission.

The monitoring IC 33 may be referred to as a cell monitoring circuit (CSC). CSC is an abbreviation for Cell Supervising Circuit. The monitoring IC 33 executes malfunction diagnosis of a circuit portion of the monitoring device 30 including the monitoring IC 33 itself. That is, the monitoring IC 33 transmits battery monitoring information including battery information and malfunction diagnosis information to the microcontroller 34. The monitoring device 30 may store (retain) the acquired battery monitoring information in a memory such as the microcontroller 34. Upon receiving data requesting acquisition of the battery monitoring information transmitted from the microcontroller 34, the monitoring IC 33 senses the battery information and transmits the battery monitoring information including the battery information to the microcontroller 34. In addition to the above example, the battery monitoring information may include, for example, information such as a flue gas temperature, an impedance, a state of balancing of cell voltages, a stack voltage, a state of synchronization with the controller 40, or presence or absence of abnormality of detection wiring.

The microcontroller 34 is a microcomputer and includes a CPU as a processor, a ROM and a RAM as memories, an input/output interface, a bus that connects these components. The CPU constructs multiple functional units by executing various programs stored in the ROM while using a temporary storage function of the RAM. ROM is abbreviation for Read Only Memory. The RAM is abbreviation for Random Access Memory.

The microcontroller 34 controls a schedule of sensing and self-diagnosis performed by the monitoring IC 33. The microcontroller 34 receives the battery monitoring information transmitted from the monitoring IC 33 and transmits the battery monitoring information to the wireless IC 35. The microcontroller 34 transmits data requesting acquisition of the battery monitoring information to the monitoring IC 33. For example, upon receiving the data requesting acquisition of the battery monitoring information transmitted from the wireless IC 35, the microcontroller 34 may transmit the data requesting acquisition of the battery monitoring information to the monitoring IC 33. The microcontroller 34 may autonomously request the monitoring IC 33 to acquire the battery monitoring information. For example, the microcontroller 34 may cyclically request the monitoring IC 33 to acquire the battery monitoring information.

The wireless IC 35 includes an RF circuit and a microcontroller (not illustrated) in order to wirelessly transmit and receive data. The microcontroller of the wireless IC 35 includes a memory. The wireless IC 35 has a transmission function of modulating transmission data and oscillating at a frequency of an RF signal. The wireless IC 35 has a reception function of demodulating received data. RF is an abbreviation for Radio Frequency.

The wireless IC 35 modulates the data including the battery monitoring information transmitted from the microcontroller 34, and transmits the modulated data to another node such as the controller 40 via the front end circuit 36 and the antenna 37. The wireless IC 35 adds data necessary for wireless communication such as communication control information to the transmission data including the battery monitoring information, and then transmits the data. The data necessary for wireless communication includes, for example, an identifier (ID) and an error detection code. The wireless IC 35 controls a data size, a communication format, a schedule, and error detection in wireless communication with another node, for example.

The wireless IC 35 receives data transmitted from another node via the antenna 37 and the front end circuit 36, and then demodulates the data. For example, upon receiving data including a transmission request for battery monitoring information, the wireless IC 35 transmits data including the battery monitoring information to the other node in response to the request. In addition to the battery monitoring information described above, the monitoring device 30 may transmit battery traceability information and/or manufacturing history information to the other node. The battery traceability information is, for example, the number of charge/discharge times, the number of malfunctions, and a total charge/discharge time. The manufacturing history information is, for example, a manufacturing date, a place, a manufacturer, a serial number, and a manufacturing number. The manufacturing history information is stored in a memory included in the monitoring device 30. The monitoring device 30 may transmit the battery traceability information and/or the manufacturing history information instead of the battery monitoring information described above to the other node.

The front end circuit 36 includes a matching circuit for impedance matching between the wireless IC 35 and the antenna 37, and a filter circuit for removing unnecessary frequency components.

The antenna 37 converts an electric signal into radio waves and emits the radio waves into a space. The antenna 37 receives radio waves propagating in the space and converts the radio waves into an electric signal.

<Controller>

Next, the controller 40 will be described with reference to FIG. 4. The controller 40 includes a power supply circuit (PSC) 41, the antenna (ANT) 42, a front end circuit (FE) 43, a wireless IC (WIC) 44, a main microcontroller (MMC) 45, and a sub microcontroller (SMC) 46. Communication between elements inside the controller 40 is performed by wire.

The power supply circuit 41 uses a voltage supplied from a battery (BAT) 15 to generate an operating power source for other circuit elements included in the controller 40. The battery 15 is a DC voltage source mounted on the vehicle 10 and different from the battery pack 11. The battery 15 supplies electric power to an auxiliary machine of the vehicle 10, and therefore may be referred to as an auxiliary battery. In the present embodiment, the power supply circuit 41 includes power supply circuits 411 and 412. The power supply circuit 411 generates a predetermined voltage using the voltage supplied from the battery 15 and supplies the generated voltage to the main microcontroller 45 and the sub microcontroller 46. For simplification of the drawings, electrical connection between the power supply circuit 411 and the sub microcontroller 46 is omitted. The power supply circuit 412 generates a predetermined voltage using the voltage generated by the power supply circuit 411 and supplies the predetermined voltage to the wireless IC 44.

The antenna 42 converts an electric signal into radio waves and emits the radio waves into a space. The antenna 42 receives radio waves propagating in the space and converts the radio waves into an electric signal.

The front end circuit 43 includes a matching circuit for impedance matching between the wireless IC 44 and the antenna 42, and a filter circuit for removing unnecessary frequency components.

The wireless IC 44 includes an RF circuit and a microcontroller (not illustrated) in order to wirelessly transmit and receive data. The wireless IC 44 has a transmission function and a reception function like the wireless IC 35. The wireless IC 44 receives data transmitted from the monitoring device 30 via the antenna 42 and the front end circuit 43, and then demodulates the data. The wireless IC 44 transmits data including battery monitoring information to the main microcontroller 45. The wireless IC 44 receives and modulates data transmitted from the main microcontroller 45, and transmits the data to the monitoring device 30 via the front end circuit 43 and the antenna 42. The wireless IC 44 adds data necessary for wireless communication such as communication control information to the transmission data and transmits the data. The data necessary for wireless communication includes, for example, an identifier (ID) and an error detection code. The wireless IC 44 controls a data size, a communication format, a schedule, and error detection in wireless communication with other nodes.

The main microcontroller 45 is a microcomputer including a CPU, a ROM, a RAM, an input/output interface, and a bus that connects these components. The ROM stores various programs to be executed by the CPU. The main microcontroller 45 generates a command requesting the monitoring device 30 to perform predetermined process, and transmits transmission data including the command to the wireless IC 44. The main microcontroller 45 generates, for example, a command for requesting transmission of battery monitoring information. The main microcontroller 45 may generate a command for requesting not only acquisition of battery monitoring information but also transmission of the battery monitoring information. A request described herein may be referred to as an instruction.

The main microcontroller 45 receives data including battery monitoring information transmitted from the wireless IC 44, and performs predetermined process on the basis of the battery monitoring information. In the present embodiment, the main microcontroller 45 acquires a cell current from the current sensor, and performs predetermined process on the basis of the battery monitoring information and the acquired cell current. For example, the main microcontroller 45 performs a process of transmitting the acquired battery monitoring information to the ECU 14. The main microcontroller 45 may calculate at least one of the internal resistance, the open circuit voltage (OCV), the SOC, and the SOH of the battery cell 22 on the basis of the battery monitoring information, and transmit information including the calculated data to the ECU 14. OCV is an abbreviation for Open Circuit Voltage.

The main microcontroller 45 performs estimation process to estimate the internal resistance and the open circuit voltage of the battery cell 22 on the basis of, for example, the cell voltage and the cell current. The open circuit voltage is a cell voltage corresponding to the SOC of the battery cell 22. The open circuit voltage is a cell voltage when no current flows. The open circuit voltage and the cell voltage acquired by the monitoring device 30 have a difference by a voltage drop according to the internal resistance and the cell current. The internal resistance changes according to the cell temperature. The lower the cell temperature, the larger the value of the internal resistance. The main microcontroller 45 performs estimation process to estimate the internal resistance and the open circuit voltage of the battery cell 22 in also consideration of, for example, the cell temperature.

The main microcontroller 45 may instruct execution of balancing process for equalizing the voltages of the battery cells 22 on the basis of the battery monitoring information. The main microcontroller 45 may acquire an IG signal of the vehicle 10 and perform the above-described processes according to the driving state of the vehicle 10. "IG" is an abbreviation of "ignition". The main microcontroller 45 may perform process of detecting an abnormality of the battery cell 22 or the circuit on the basis of the battery monitoring information, and may transmit abnormality detection information to the ECU 14.

The sub microcontroller 46 is a microcomputer including a CPU, a ROM, a RAM, an input/output interface, and a bus that connects these components. The ROM stores various programs to be executed by the CPU. The sub microcontroller 46 performs a monitoring process inside the controller 40. For example, the sub microcontroller 46 may monitor data between the wireless IC 44 and the main microcontroller 45. The sub microcontroller 46 may monitor a state of the main microcontroller 45. The sub microcontroller 46 may monitor a state of the wireless IC 44.

<Wireless Communication>

Figure 5:
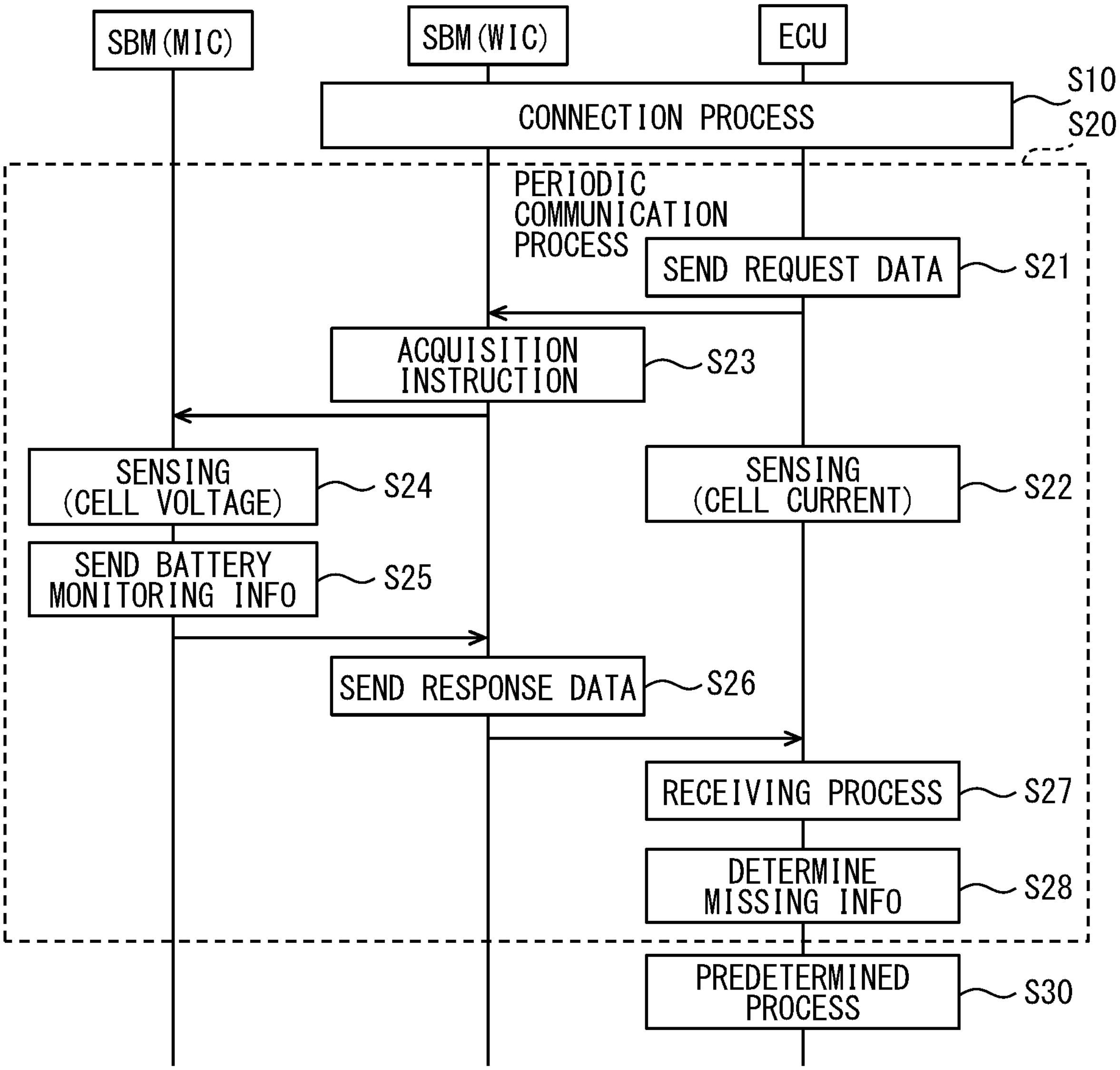
FIG. 5 is a diagram illustrating a communication sequence between a monitoring device and a controller.
Figure 6:
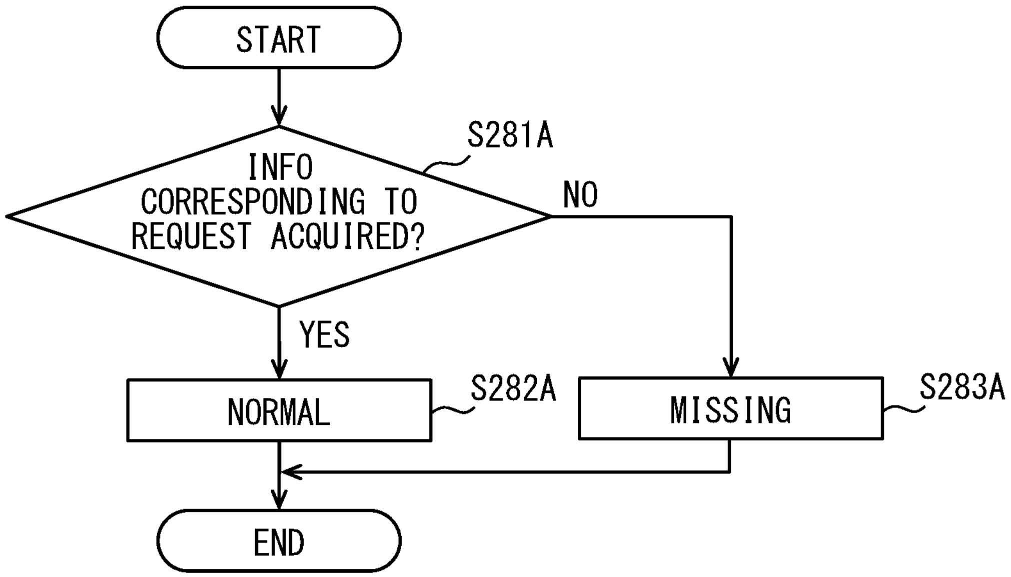
FIG. 6 is a flowchart illustrating a missing determination process executed by a controller.

Next, wireless communication between the monitoring devices 30 and the controller 40 will be described with reference to FIGS. 5 and 6. FIG. 5 is a diagram showing an example of a communication sequence between the monitoring device 30 and the controller 40. The communication sequence may be referred to as a communication flow. In FIG. 5, the monitoring device 30 is shown as a SBM, the monitoring IC 33 is shown as a MIC, the wireless IC 35 is shown as a WIC, and the controller 40 is shown as an ECU. FIG. 6 is a flowchart illustrating a missing determination process executed by the controller. The processes performed by the controller 40 shown below are specifically executed by the wireless IC 44 and the main microcontroller 45.

The battery management system 60 of the present embodiment performs star network communication when the number of nodes is 3 or more. That is, the controller 40 performs wireless communication with each of the monitoring devices 30. Wireless communication between one monitoring device 30 and the controller 40 will be described hereinbelow for convenience. The controller 40 performs similar processes with all the monitoring devices 30.

For performing wireless communication, the monitoring device 30 and the controller 40 first execute a connection process as shown in FIG. 5 (step S10). In step S10, the monitoring device 30 and the controller 40 make a connection of for the wireless communication.

The monitoring devices 30 and the controller 40 execute the connection process, for example, at an activation time. The time of startup is, for example, a time when an operation power is supplied. In a configuration in which power is constantly supplied from the battery stack 21 and the battery 15, the monitoring devices 30 and the controller 40 are started up after a manufacturing process of the vehicle 10 or the replacement of parts at a repair shop. The activation time may be a time at which the controller 40 is supplied with an activation signal such as an IG signal or an SMR switching-on signal. For example, the activation time is when the IG signal is switched from off to on by operation by a user. At the activation time, the connection process is executed between the controller 40 and all the monitoring devices 30 that are to be connected in the wireless communication with the controller 40. SMR is an abbreviation for System Main Relay. The SMR is provided on a power line connecting the battery pack 11 and the PCU 12. The SMR is turned on to electrically connect the battery pack 11 and the PCU 12, and is turned off to disconnect the battery pack 11 and the PCU 12.

When the connection state is disconnected, the monitoring device 30 and the controller 40 execute the connection process. That is, the monitoring device 30 and the controller 40 executes reconnection. The controller 40 executes reconnection with the disconnected monitoring device 30 while continuing data communication (periodic communication process) with the other connected monitoring devices 30. For example, disconnection occurs due to deterioration of the communication environment.

The connection process includes, for example, a connection establishment process and a pairing process. In the connection establishment process, for example, the controller 40 performs a scanning operation, and the monitoring device 30 performs an advertising operation. In the pairing process, unique information is exchanged between the monitoring device 30 and the controller 40 for encryption of communication. Unique information is, for example, key information or information for generating a key.

When the connection process described above is completed, the monitoring device 30 and the controller 40 perform a periodic communication process (step S20). The monitoring device 30 periodically and cyclically performs data communication with the controller 40. In the periodic communication process, the controller 40 transmits request data (step S21) to the monitoring device 30 that has completed the connection process with the controller 40. The request data includes a request for battery monitoring information. The request data includes, for example, a request for acquisition of battery monitoring information and a request for transmission of the acquired battery monitoring information.

When the controller 40 transmits the request data, the controller 40 senses the cell current (step S22). The controller 40 of the present embodiment acquires the cell current from the current sensor by wire. In step S22, the controller 40 acquires the value of the cell current at substantially the same timing as the monitoring device 30 senses the cell voltage or the like.

Upon receiving the request data, the wireless IC 35 of the monitoring device 30 transmits a request for acquisition of the battery monitoring information, that is, an acquisition instruction to the monitoring IC 33 (step S23). The wireless IC 35 of the present embodiment transmits the acquisition request to the monitoring IC 33 via the microcontroller 34.

Upon receiving the acquisition request, the monitoring IC 33 executes sensing (step S24). The monitoring IC 33 performs sensing and acquires battery information of each battery cell 22. The battery information includes the cell voltage and the cell temperature. Further, the monitoring IC 33 executes a failure diagnosis of a circuit constituting the monitoring device 30.

Next, the monitoring IC 33 transmits the acquired battery monitoring information to the wireless IC 35 (step S25). In the present embodiment, the monitoring IC 33 transmits battery monitoring information including a malfunction diagnosis result as well as battery information. The monitoring IC 33 transmits the monitoring data to the wireless IC 35 via the microcontroller 34.

When the wireless IC 35 receives the battery monitoring information that the monitoring IC 33 has acquired, the wireless IC 35 transmits transmission data including the battery monitoring information, that is, response data to the controller 40 (step S26).

The controller 40 executes a reception process at step S27 after the execution of step S22. Next, the controller 40 determines whether the battery monitoring information is missing (step S28).

The controller 40 determines missing of the battery monitoring information, for example, based on success or failure of acquisition of the response data corresponding to the request data, that is, success or failure of acquisition of the battery monitoring information. As shown in FIG. 6, the controller 40 determines whether the controller 40 has acquired the battery monitoring information corresponding to the request data (step S281A). When the battery monitoring information corresponding to the request data is determined to have been acquired, the controller 40 determines that missing of the battery monitoring information has not occurred, that is, it is normal (step S282A). When the battery monitoring information corresponding to the request data is determined to have not been acquired, the controller 40 determines that missing of the battery monitoring information has occurred (step S283A).

The controller 40 determines that missing of the battery monitoring information has occurred when the response data cannot be received in the process of step S27 within a predetermined time since transmission of the request data at step S21 due to, for example, communication interruption. The interruption is caused by deterioration of a communication environment. The controller 40 may determine that missing of the battery monitoring information has occurred when the response data is received but a communication error is detected by an inspection executed at the time of reception, that is, the battery monitoring information cannot be used for a predetermined process. For example, the controller 40 performs an inspection using, for example, an error detection code at the time of reception of the response data.

The controller 40 sets a cycle in which the controller 40 makes a round of the monitoring devices 30 in order to perform wireless communication with each of the monitoring devices 30. That is, the controller 40 executes the periodic communication process with each of the monitoring devices 30 in order within one cycle. The controller 40 periodically executes the processes of steps S21 to S28 described above with the monitoring device 30 for which the connection has been established according to the preset cycle.

The controller 40 executes a predetermined process based on the battery monitoring information (step S30). The controller 40 includes, as the predetermined process, a process executed based on, for example, battery monitoring information acquired during a predetermined period. The controller 40 of the present embodiment executes estimation of an internal resistance of the battery cell 22 and/or estimation of an open circuit voltage (OCV) based on the multiple battery information acquired during the predetermined period. The SOH can be calculated based on the internal resistance. Further, by comparing the open circuit voltages of the battery cells 22, an abnormality of the battery cells 22 can be detected. The controller 40 may execute these processes as a part of the predetermined process.

In addition to the above-described estimation process, the controller 40 may include, as the predetermined process, a process executed every time the battery monitoring information is acquired. The controller 40 may perform an abnormality diagnosis based on malfunction diagnosis information every time, for example, the battery monitoring information is acquired. The controller 40 may transmit the acquired battery monitoring information to the ECU 14 each time the battery monitoring information is acquired, for example.

While an example in which the monitoring device 30 acquires battery monitoring information on the basis of an acquisition request from the controller 40 has been described, the present invention is not limited to this example. The monitoring device 30 may autonomously acquire battery monitoring information and transmit the battery monitoring information to the controller 40 on the basis of a transmission request from the controller 40. Accordingly, the process of step S23 in response to an acquisition request can be omitted. In other words, the battery monitoring information acquired by the monitoring device 30 and the wired information acquired by the controller 40 by wire, which are the information used by the controller 40 in the predetermined process, may be acquired at substantially the same timing as each other.

<Internal Resistance and Open Circuit Voltage>

Figure 7:
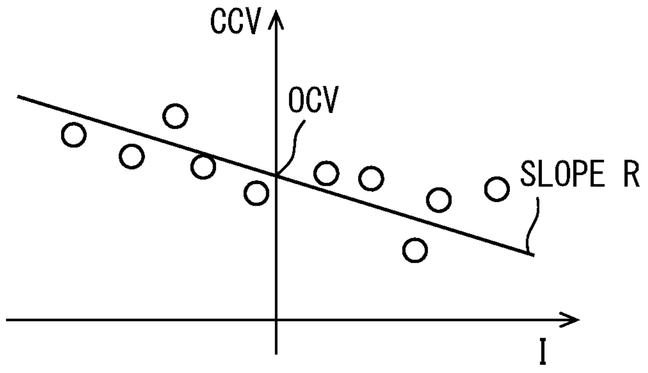
FIG. 7 is a diagram showing I-V characteristics.

Next, the internal resistance and the open circuit voltage (OCV) of a battery cell 22 will be described with reference to FIG. 7. FIG. 7 is a diagram showing I-V characteristics. In FIG. 7, the number of samplings is set to 10 for convenience.

As described above, there is a difference between the open circuit voltage OCV, which is a cell voltage according to the SOC of the battery cell 22 and the cell voltage acquired (i.e. detected) by the monitoring device 30. The difference is a voltage drop depending on the internal resistance of the battery cell 22 and the cell current flowing through the battery cell 22. In the following, the cell voltage acquired by the monitoring device 30 may be referred to as a closed circuit voltage (CCV). CCV is an abbreviation for Closed Circuit Voltage. The open circuit voltage is sometimes referred to as an open voltage.

As shown in FIG. 7, the closed circuit voltage CCV and the open circuit voltage OCV have a relationship of CCV=OCV±I×R. The horizontal axis shown in FIG. 7 is the cell current I, the vertical axis is the closed circuit voltage CCV, the slope is the internal resistance R, and the intercept is the open circuit voltage OCV. The closed circuit voltage CCV and the open circuit voltage OCV have a relationship of CCV=OCV−I×R when the battery cell 22 is discharged. Similarly, when the battery cell 22 is charged, the closed circuit voltage CCV and the open circuit voltage OCV have a relationship of CCV=OCV+I×R.

The controller 40 estimates the internal resistance and/or the open circuit voltage by using multiple battery information records which are obtained by sampling during the predetermined period. The battery information includes at least the cell voltage (CCV) acquired by the monitoring device 30 and the cell current acquired by the controller 40. The controller 40 estimates the internal resistance and/or the open circuit voltage by calculation using, for example, the least squares method. In order to calculate the internal resistance or the open circuit voltage by the least squares method, several to several tens of data, that is, a time (predetermined period) of ten to several tens of cycles is necessary. The controller 40 estimates the internal resistance and/or the open circuit voltage for each of the battery cells 22.

<Estimation Process>

Figure 8:
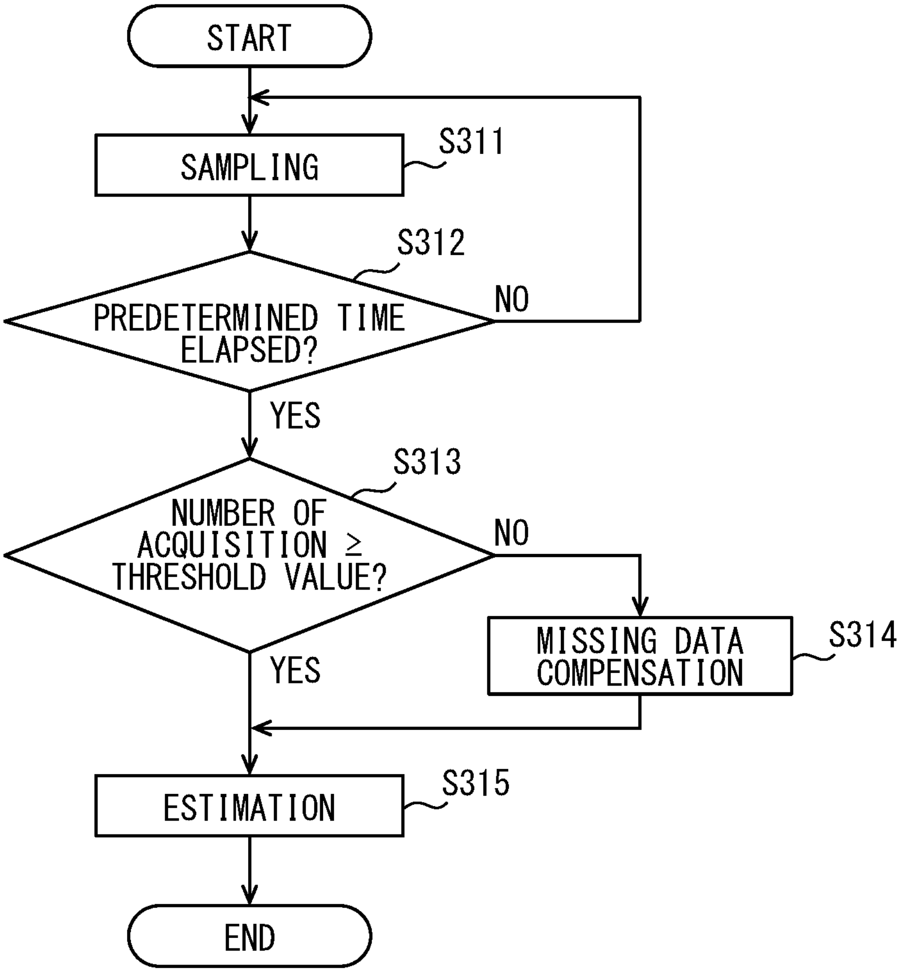
FIG. 8 is a flowchart illustrating an estimation process executed by a controller.
Figure 9:
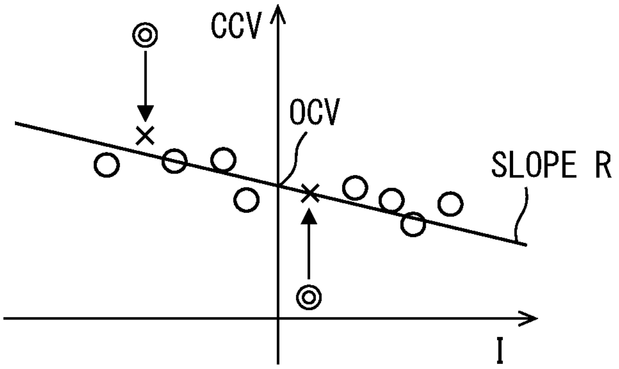
FIG. 9 is a diagram illustrating missing and complementation of data.

Next, the estimation process executed by the controller 40 to estimate of the internal resistance and/or the open circuit voltage will be described with reference to FIGS. 8 and 9. FIG. 8 is a flowchart illustrating an estimation process executed by the controller 40. FIG. 9 is a diagram illustrating missing and complementation of data. In FIG. 9, for convenience, the number of samplings including missing data is set to 10. x (cross or X symbol) shown in FIG. 9 indicates missing of data, and ○ (circle symbol) indicates acquisition of data. ◎ (double circle symbol) indicates complementary data.

The controller 40 executes the estimation process shown in FIG. 8 as one of the predetermined processes (step S30) described above. The controller 40 performs the estimation process in parallel with the periodic communication process. The controller 40 performs the estimation process shown in FIG. 8 for each battery cell 22 based on acquired information about cell discrimination. The controller 40 repeatedly executes the estimation process shown in FIG. 8.

As shown in FIG. 8, the controller 40 first samples battery information (step S311). The controller 40 samples battery information at a timing corresponding to the cycle of the periodic communication process. That is, the controller 40 samples once in one cycle. If there is no missing of data, the controller 40 acquires the cell voltage and the cell current as battery information by sampling. When there is missing of data, the controller 40 acquires only the cell current as battery information by sampling.

The controller 40 stores, for example, battery information, time information, missing information, etc. acquired by the sampling in a memory such as a RAM such that these information are linked to each other. The time information may be the timing of sensing the battery information or the timing of sampling in step S311. The missing information is information indicating the result of the missing determination process in step S28. The missing information may be given only when missing of data has occurred.

Next, the controller 40 determines whether a predetermined period has elapsed (step S312). As described above, the predetermined period is set as a time of ten to several tens of cycles of the periodic communication process in order to secure the number of sampling data required for calculating the internal resistance or the like by the least squares method. The controller 40 repeats the processes of steps S311 and S312 until the predetermined period elapses. As a result, multiple sampling data are stored in the memory. In addition, instead of the predetermined period, the completion of sampling may be determined whether the number of samplings has reached a specified number.

When the predetermined period elapses, the controller 40 determines whether the number of acquired cell voltages during the predetermined period is equal to or greater than a predetermined threshold value (step S313). The number of cell voltages acquired is the number of samplings minus the number of missing data. The threshold value may be set to allow some missing data for sampling opportunities. The threshold may be, for example, a minimum number of samples for accurate estimation of the internal resistance and/or the open circuit voltage by the method of least squares. The threshold value may be set so as not to allow missing of the cell voltage. That is, the threshold value may be the number of samplings expected in the predetermined period.

If the number of acquisitions is less than the threshold value, the controller 40 executes a process of complementing missing data (step S314). The controller 40 estimates the missing cell voltage using an acquired cell voltage, as will be described later. The controller 40 uses the cell voltage estimated from the other cell voltage for the missing cell voltage. The controller 40 adds the estimated cell voltage to the battery information having only the cell current due to the data missing, and then stores the battery information.

The controller 40 complements the missing data so that the number of acquisitions including the complementary data is equal to or more than the threshold value. The controller 40 may determine the number of complements for the missing data so that, for example, the number of acquisitions including the complementary data is equal to the threshold value. Of course, the controller 40 may complement all the missing data. In the example shown in FIG. 9, the cell voltages of the two missing data are complemented by the estimated cell voltages.

When the number of acquisitions is equal to or greater than the threshold value in step S313, the controller 40 executes a process of estimating the internal resistance and/or the open circuit voltage (step S315). When the above-mentioned complement process is executed, the controller 40 then executes the estimation process. The controller 40 estimates the internal resistance and/or the open circuit voltage by calculation using the least squares method based on a dozen to several tens of battery information including both the cell voltage and the cell current. When the estimation process has been executed, the controller 40 ends series of processes and starts next sampling.

<Complementation of Missing Data>

Figure 10:
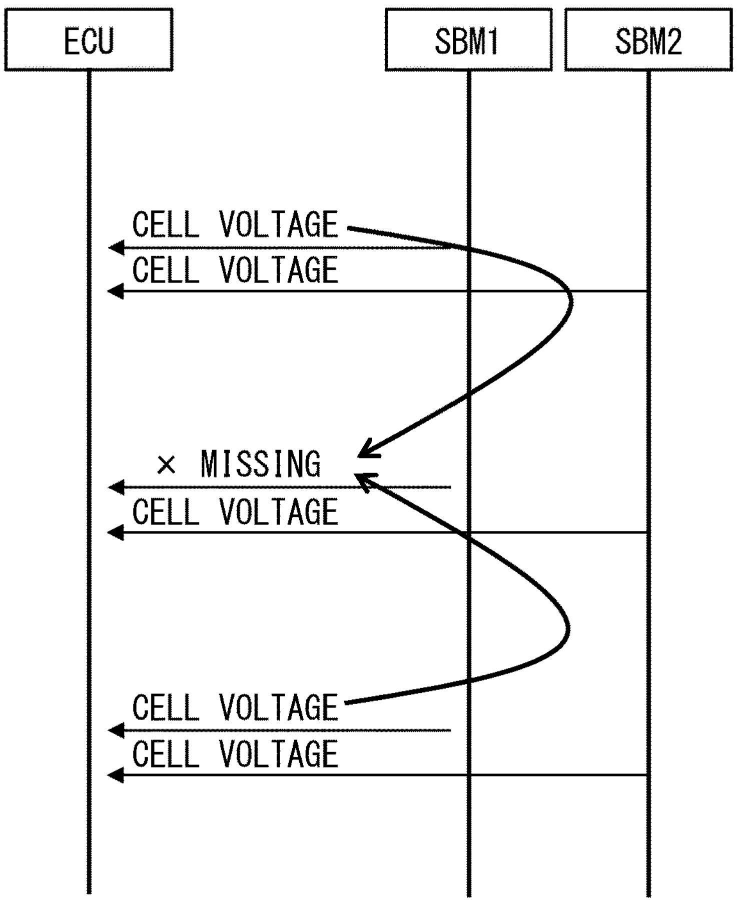
FIG. 10 is a diagram illustrating an example of complementation of data.
Figure 11:
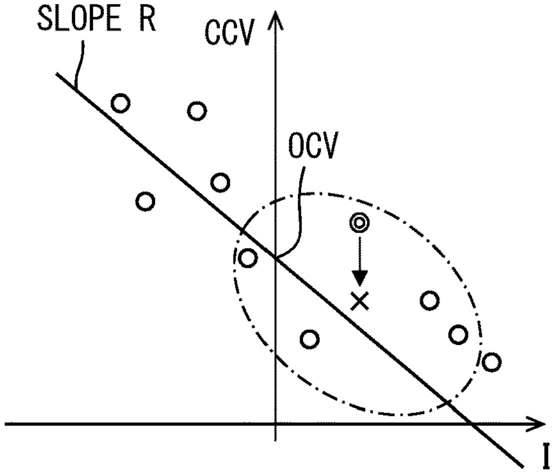
FIG. 11 is a diagram illustrating another example of complementation of data.
Figure 12:
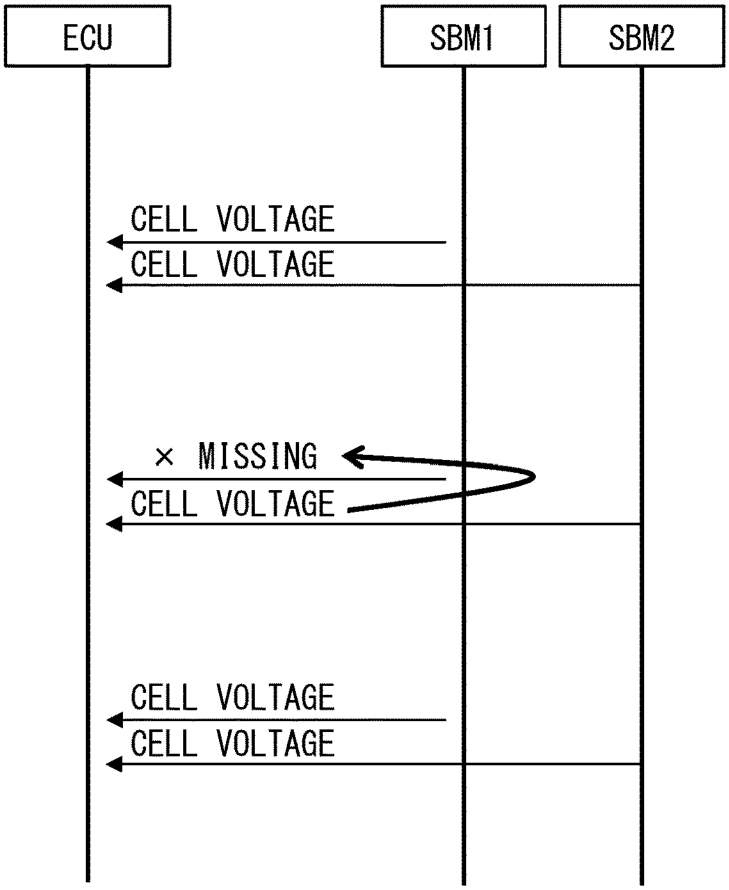
FIG. 12 is a diagram illustrating another example of complementation of data.

Next, a method of complementing the missing data will be described with reference to FIGS. 10 to 12. FIGS. 10 and 11 are diagrams showing examples of complementation of data using data of the same monitoring device 30. FIG. 12 is a diagram showing an example of complementation of data using data of another monitoring device 30. In FIG. 11, for convenience, the number of samplings including missing data is set to 10.

The controller 40 may complement a missing cell voltage by estimation using a cell voltage obtained from the monitoring device 30 corresponding to the missing cell voltage and acquired at timing close to the timing of occurrence of data missing. That is, data close to the missing timing in the same monitoring device 30 may be used for complementation of the missing data. Within a short time before and after the missing, the cell voltage is unlikely to change suddenly. Since the complementary cell voltage is a cell voltage of the battery cell 22 in which missing of a cell voltage has occurred and is acquired at timing close to the timing of the missing of the cell voltage, the missing cell voltage can be complemented by the complementary cell voltage close to the missing cell voltage. Therefore, an accuracy in estimation of the internal resistance and/or the open circuit voltage can be improved.

For example, the controller 40 may use a cell voltage acquired immediately before and/or immediately after the timing of missing of a cell voltage, as shown in FIG. 10. A value equal to the previous cell voltage or the next cell voltage may be used as an estimated value of the missing cell voltage. An average value of cell voltages acquired in few cycles around the timing of missing of a cell voltage may be used as the estimated value. For example, an average value of previous several cycles, an average value of next several cycles, or an average value of previous and next cycles may be used as the estimated value.

By using the data immediately before and/or immediately after the timing of missing of data, an execution timing of the estimation process will be delayed not a little. However, since the internal resistance does not change suddenly, even if the estimation of the internal resistance is delayed, there is almost no effect on the system of the vehicle 10.

The controller 40 may create a graph of the I-V distribution shown in FIG. 11 using the battery information acquired by sampling, and complement the missing cell voltage from the data around the missing in this graph by estimation. Since the I-V characteristic tends to show a straight line, the missing cell voltage can be estimated from cell voltages corresponding to cell currents close to a cell current of the missing cell voltage.

As shown in FIG. 12, the controller 40 may complement a missing cell voltage by a cell voltage obtained from another monitoring device 30 (SBM2) different from the monitoring device 30 (SBM1) corresponding to the missing cell voltage and acquired in the same cycle as the missing cell voltage acquired. The cell voltage of the same cycle is acquired at almost the same timing as the missing cell voltage. Therefore, it is expected that the cell voltage will be closer to the missing cell voltage than a cell voltage acquired in different cycles. Therefore, an accuracy in estimation of the internal resistance and/or the open circuit voltage can be improved. This complementation method may be used in combination with the complementation method in which a cell voltage obtained from the monitoring device 30 corresponding to the missing cell voltage and close to the timing at which data missing occurs is used. For example, an amount of change in the cell voltage of the SBM2 may be added to a previous voltage of the SBM1 acquired immediately before acquisition of the missing cell voltage, and the amount of change of the SBM2 plus the previous voltage of the SBM1 may used for complementation of the missing cell voltage.

The controller 40 may estimate the missing cell voltage by using at least one of information such as position information, distance information, usage history, deterioration information, and the SOC of the battery cell 22. From the above information, the controller 40 identifies a battery cell 22 under supervision of another monitoring device 30 and having a voltage value that tends to be close to a cell voltage of a battery cell 22 in which missing of cell voltage occurs. Then, the controller 40 uses the cell voltage of the identified battery cell 22 as the estimated value, for example, a value acquired in the same cycle as the missing timing. The controller 40 may perform the estimation using, for example, a cell voltage of a battery cell 22 which is close in distance from the battery cell 22 in which the missing of data occurs.

Summary of First Embodiment

According to the present embodiment, the controller 40 holds information regarding a request data as information related to battery monitoring information to be acquired. As a result, the controller 40 is capable of determining whether missing of the battery monitoring information has occurred based on a correlation between the battery monitoring information acquired from the monitoring device 30 via wireless communication and the request data which is the information related to the battery monitoring information. When the battery monitoring information corresponding to the request data cannot be acquired, the controller 40 determines that missing of the battery monitoring information has occurred. As a result, missing of the battery monitoring information can be detected. The controller 40 can execute the predetermined process in consideration of the missing of the battery monitoring information.

In the present embodiment, the controller 40 acquires wired information indicating the state of the battery via wired communication without the monitoring device 30. Since the wired information is acquired via wired communication, the wired information has no missing unlike battery monitoring information acquired via wireless communication. That is, even if missing of the battery monitoring information has occurred, the controller 40 can surely acquire a part of the battery state. For example, battery information that may largely affect the system of the vehicle 10 can be acquired. Therefore, the predetermined process can be executed based on the acquired wired information.

In this embodiment, the controller 40 estimates the internal resistance and/or the open circuit voltage of the battery cell 22 based on the acquired cell voltage and the acquired cell current. The controller 40 acquires battery monitoring information including the cell voltage via wireless communication, and acquires the cell current via wired communication. The cell current among parameters used in the estimation process is wired information and can be reliably acquired. Accordingly, the process using the cell current is possible.

In the present embodiment, the controller 40 executes the estimation process when the number of acquired cell voltages during the predetermined period is equal to or greater than the predetermined threshold value. According to this, since the estimation process is executed after securing a large amount of data, an accuracy in estimation of the internal resistance and/or the open circuit voltage can be improved.

In the present embodiment, when the number of acquired cell voltages is less than the threshold value, the controller 40 complements the missing cell voltage and executes the estimation process. According to this, the estimation process can be executed even if missing of battery monitoring information occurs. That is, the frequency of estimation of internal resistance and/or the open circuit voltage can be improved.

In the present embodiment, an example in which the controller 40 acquires the cell current via wired communication is shown, but the present invention is not limited to this. The controller 40 may also acquire the cell current as battery monitoring information via wireless communication. In this case, if battery monitoring information is missing, the controller 40 cannot acquire either the cell voltage or the cell current by sampling. Therefore, in the complementation process, both the cell voltage and the cell current are complemented.

In this embodiment, an example of estimating the internal resistance and/or the open circuit voltage based on the cell voltage and the cell current is shown. However, other battery monitoring information may be used in addition to the cell voltage. For example, the lower the cell temperature, the higher the internal resistance. Thus, the controller 40 may estimate the internal resistance and/or the open circuit voltage based on the cell voltage, cell temperature, and the cell current.

Second Embodiment

This embodiment is a modification based on the preceding embodiment, and the description of the preceding embodiment can be incorporated. In the preceding embodiment, the request data for requesting the battery monitoring information is used as wired information used for the missing determination. Instead of this, the cell current may be used as the wired information.

Figure 13:
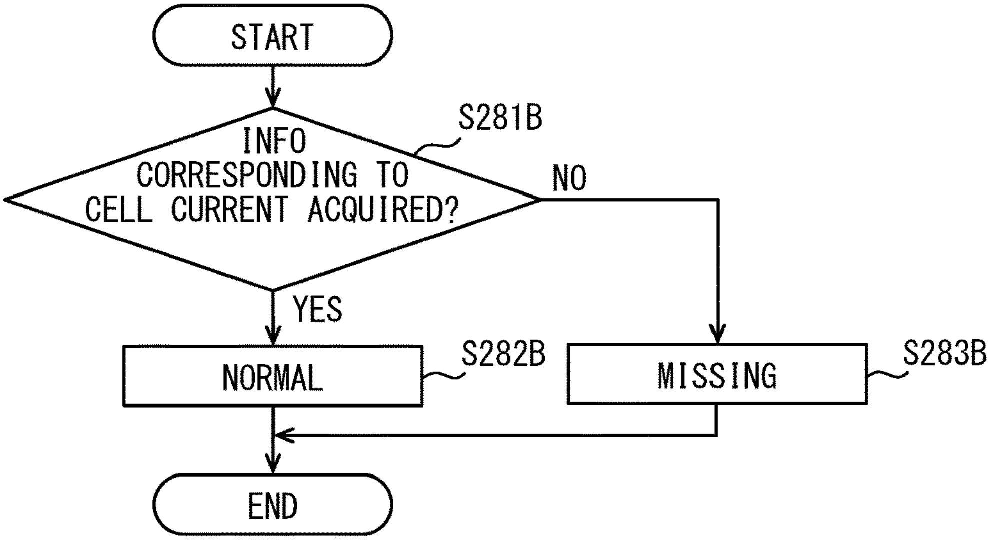
FIG. 13 is a flowchart showing a missing determination process executed by a controller in a battery management system according to a second embodiment.

FIG. 13 is a flowchart showing an example of a missing determination process executed by a controller 40 in a battery management system 60 according to a second embodiment. The controller 40 executes a process shown in FIG. 13 in the missing determination at step S28 shown in FIG. 5. The controller 40 determines missing of battery monitoring information based on success or failure of acquisition of battery monitoring information corresponding to information (wired information) indicating the state of the battery acquired by wire.

As shown in FIG. 13, the controller 40 determines whether the controller 40 has acquired the battery monitoring information corresponding to the cell current which is the wired information (step S281B). When the battery monitoring information corresponding to the cell current is determined to have been acquired, the controller 40 determines that missing of the battery monitoring information has not occurred, that is, it is normal (step S282B). When the battery monitoring information corresponding to the cell current is determined to have not been acquired, the controller 40 determines that missing of the battery monitoring information has occurred (step S283B).

Other configurations are similar to those described in the preceding embodiment.

Summary of Second Embodiment

According to the present embodiment, the controller 40 holds wired information acquired by wire as information related to battery monitoring information to be acquired. As a result, the controller 40 is capable of determining whether missing of the battery monitoring information has occurred based on a correlation between the battery monitoring information acquired from the monitoring device 30 via wireless communication and the wired information which is the information related to the battery monitoring information. When the battery monitoring information corresponding to the wired information cannot be acquired, the controller 40 determines that missing of the battery monitoring information has occurred. As a result, missing of the battery monitoring information can be detected. The controller 40 can execute the predetermined process in consideration of the missing of the battery monitoring information.

As long as the controller 40 is configured to hold a wired information acquired by wire, e.g. the cell current, as the information related to the battery monitoring information to be acquired, the controller 40 can be combined with the configuration described in the preceding embodiment.

Third Embodiment

This embodiment is a modification based on the preceding embodiment, and the description of the preceding embodiment can be incorporated. In the preceding embodiment, the estimation process is executed when the number of acquired battery information in a predetermined period is equal to or greater than a threshold value. Instead of this, the estimation process may be executed when the number of missing data in a predetermined period is less than or equal to a predetermined number.

Figure 14:
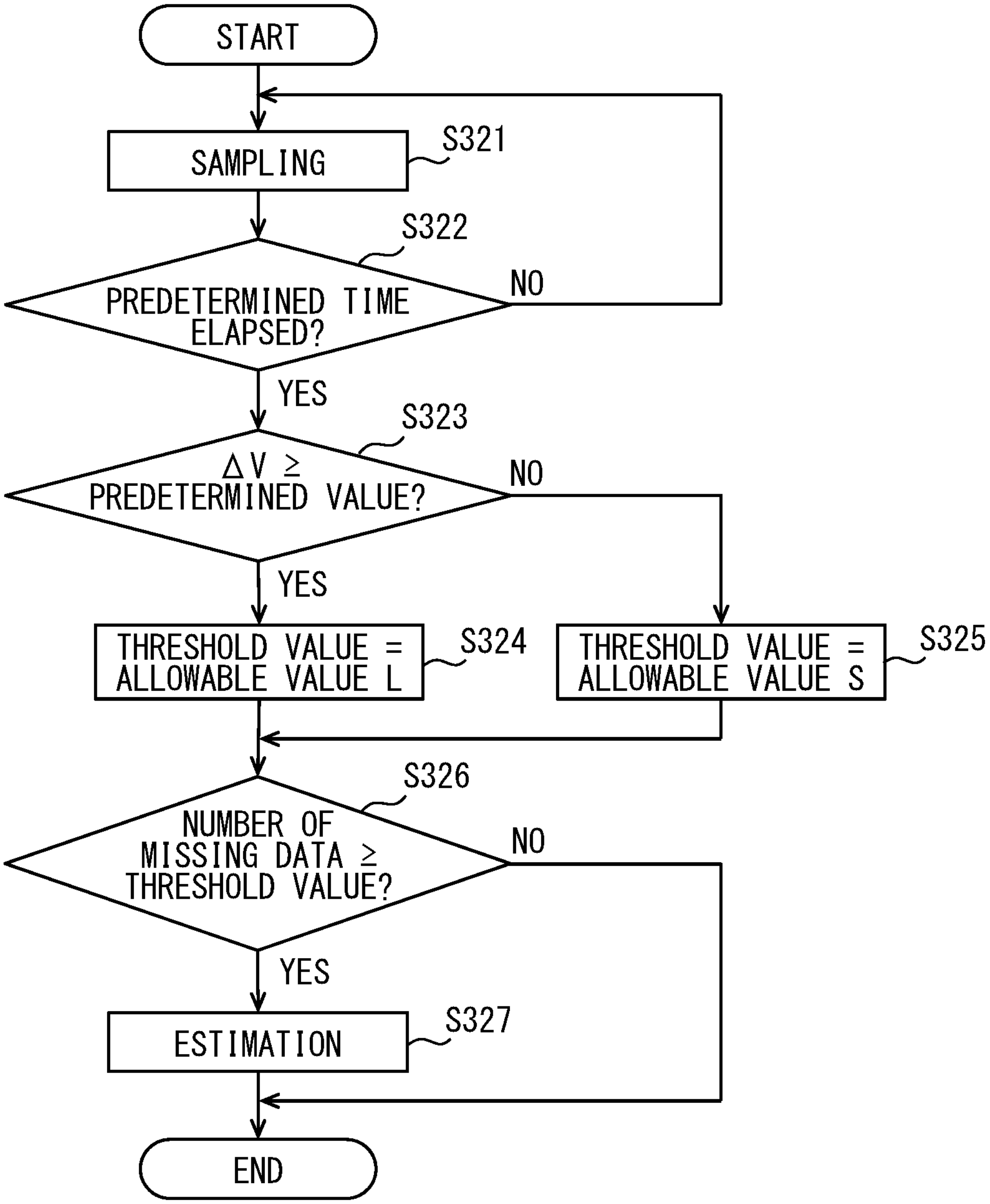
FIG. 14 is a flowchart showing an estimation process executed by a controller in a battery management system according to a third embodiment.
Figure 15:
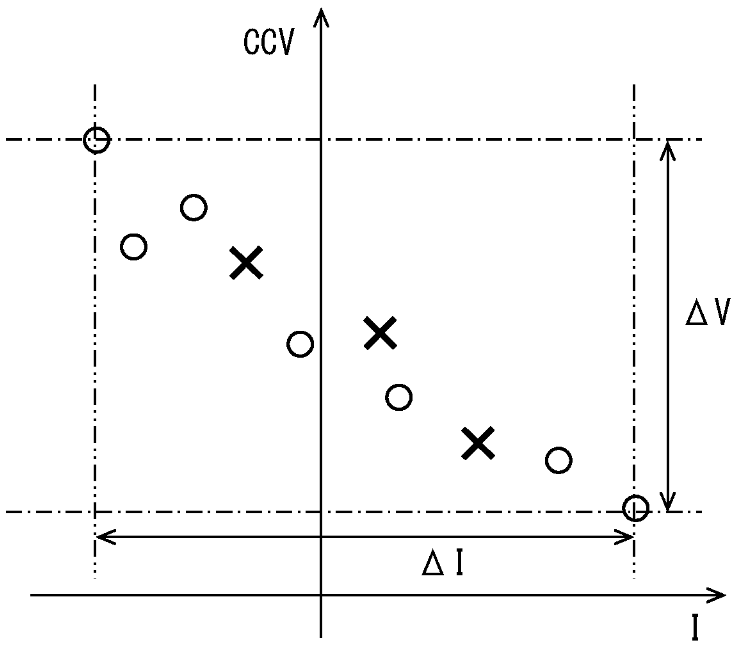
FIG. 15 is a diagram for explaining threshold setting.

FIG. 14 is a flowchart showing an estimation process executed by a controller 40 in a battery management system 60 according to the present embodiment. FIG. 15 is a diagram for explaining threshold setting. In FIG. 15, for convenience, the number of samplings including missing data is set to 10. x (cross or X symbol) shown in FIG. 15 indicates missing of data, and ○ (circle symbol) indicates acquisition of data.

The controller 40 executes the estimation process shown in FIG. 14 as one of the predetermined processes of step S30 shown in FIG. 5. The controller 40 performs the estimation process in parallel with the periodic communication process. The controller 40 performs the estimation process for each battery cell 22 based on acquired information about cell discrimination. The controller 40 repeatedly executes the estimation process shown in FIG. 14.

As shown in FIG. 14, the controller 40 first samples battery information (step S321). This process is similar to the process of step S311 of FIG. 8. If there is no missing of data, the controller 40 acquires the cell voltage and the cell current as battery information by sampling. When there is missing of data, the controller 40 acquires only the cell current as battery information by sampling.

The controller 40 stores, for example, battery information, missing information, etc. acquired by the sampling in a memory such as a RAM such that these information are linked to each other. The missing information is information indicating the result of the missing determination process in step S28. The missing information may be given only when missing of data has occurred.

Next, the controller 40 determines whether a predetermined period has elapsed (step S322). This process is similar to the process of step S312 of FIG. 8. The controller 40 repeats the processes of steps S321 and S322 until the predetermined period elapses. As a result, multiple sampling data are stored in the memory. In addition, instead of the predetermined period, the completion of sampling may be determined whether the number of samplings has reached a specified number.

After the lapse of the predetermined period, the controller 40 executes the processes of steps S323, S324, and S325 in order to set the threshold value used in step S326 described later. The controller 40 calculates, for example, a voltage width ΔV, and determines whether the voltage width ΔV is equal to or greater than a predetermined value (step S323).

As shown in FIG. 15, the voltage width ΔV is a difference between a maximum value and a minimum value of the cell voltage (CCV) among data acquired during the predetermined period by sampling. The accuracy of estimation by the least squares method is higher when the voltage width ΔV is large than when the number of data is the same and the voltage width ΔV is small. In other words, it is easy to draw an approximate straight line.

When the voltage width ΔV is equal to or greater than the predetermined value, the controller 40 sets an allowable value L as the threshold value (step S324). On the other hand, when the voltage width ΔV is less than the predetermined value, the controller 40 sets an allowable value S as the threshold value (step S325). The allowable value is a value at which the number of missing of data can be tolerated. The allowable value L is larger than the allowable value S. When the voltage width ΔV is lager than or equal to the predetermined value, the estimation accuracy can be improved even if there are many missing cell voltages. Thus, the controller 40 sets the allowable value L as the threshold value. When the voltage width ΔV is smaller than the predetermined value, the accuracy is lowered if there are many missing cell voltages. Therefore, the controller 40 sets the small allowable value S as the threshold value.

Next, the controller 40 determines whether the number of missing cell voltages during the predetermined period is equal to or less than the predetermined threshold value (step S326). As described above, when the voltage width ΔV is large, the large threshold value is set. When the voltage width ΔV is small, the small threshold value is set.

When the number of missing data is equal to or less than the threshold value, the controller 40 executes a process of estimating the internal resistance and/or the open circuit voltage (step S315). The controller 40 estimates the internal resistance and/or the open circuit voltage by calculation using the least squares method based on a dozen to several tens of battery information including both the cell voltage and the cell current. When the estimation process has been executed, the controller 40 ends series of processes and starts next sampling. When the number of missing data exceeds the threshold value, the controller 40 ends a series of processes without executing the estimation process, and starts next sampling.

Other configurations are similar to those described in the preceding embodiment.

Summary of Third Embodiment

In the present embodiment, the controller 40 executes the estimation process when the number of missing cell voltages during the predetermined period is equal to or less than the predetermined threshold value. According to this, since the estimation process is executed when the number of missing data is small, an accuracy in estimation of the internal resistance and/or the open circuit voltage can be improved. In this case, a fixed value (e.g. constant value) may be used as the threshold value for determining whether the estimation process can be executed. The threshold value may be a predetermined ratio (e.g. 10%) of the number of missing data to the number of samplings expected to be acquired in a predetermined period.

In the present embodiment, the controller 40 sets the threshold value for determining whether the estimation process can be executed based on the acquired parameters related to the state of the battery cell 22. For example, the threshold value is set based on the voltage width ΔV calculated from the cell voltages. When the voltage width ΔV is large, the estimation accuracy can be improved even if there are many missing cell voltages. Thus, the controller 40 sets a large value as the threshold value. When the voltage width ΔV is small and there are many missing cell voltages, the accuracy is lowered. Therefore, the controller 40 sets a small value as the threshold value. In this way, the controller 40 is capable of setting a value as the threshold value in accordance with the state of the battery cell 22. As a result, a frequency of estimation of the internal resistance and/or the open circuit voltage can be increased while ensuring the estimation accuracy that does not affect the control of the battery cell 22 according to the state of the battery cell 22.

In the present embodiment, an example in which the controller 40 acquires the cell current via wired communication is shown, but the present invention is not limited to this. The controller 40 may also acquire the cell current as battery monitoring information via wireless communication. In this case, if battery monitoring information is missing, the controller 40 cannot acquire either the cell voltage or the cell current by sampling.

The configuration described in the present embodiment can be combined with either of the configurations described in the first embodiment and the second embodiment.

Modification

An example in which the threshold value is set based on the voltage width ΔV has been shown, but the present invention is not limited to this. The controller 40 may set the threshold value based on other parameters relating to the state of the battery cell 22. For example, as shown in FIG. 15, the threshold value may be set based on a current width ΔI. The accuracy of estimation by the least squares method is higher when the current width ΔI is large than when the number of data is the same and the current width ΔI is small. In other words, it is easy to draw an approximate straight line. Therefore, similarly to the voltage width ΔV, a large value may be set as the threshold value when the current width ΔI is large, and a small value may be set as the threshold value when the current width ΔI is small.

The threshold value may be set based on the cell temperature. The lower the cell temperature, the higher the internal resistance. That is, the lower the cell temperature, the larger the voltage width ΔV. Therefore, a large value may be set as the threshold value when the cell temperature is low, and a small value may be set as the threshold value when the cell temperature is high.

The threshold value may be set based on the SOC. When the SOC fluctuates, the open circuit voltage also tends to fluctuate, and the voltage width ΔV becomes large. Therefore, a large value may be set as the threshold value when the fluctuation amount of SOC is large, and a small value may be set as the threshold value when the fluctuation amount of SOC is small.

Fourth Embodiment

This embodiment is a modification based on the preceding embodiment, and the description of the preceding embodiment can be incorporated. In the prior embodiment, a case where missing of data occurs successively is not specifically mentioned. Alternatively, sampling may be stopped and data may be retaken if the missing of data occurs successively.

Figure 16:
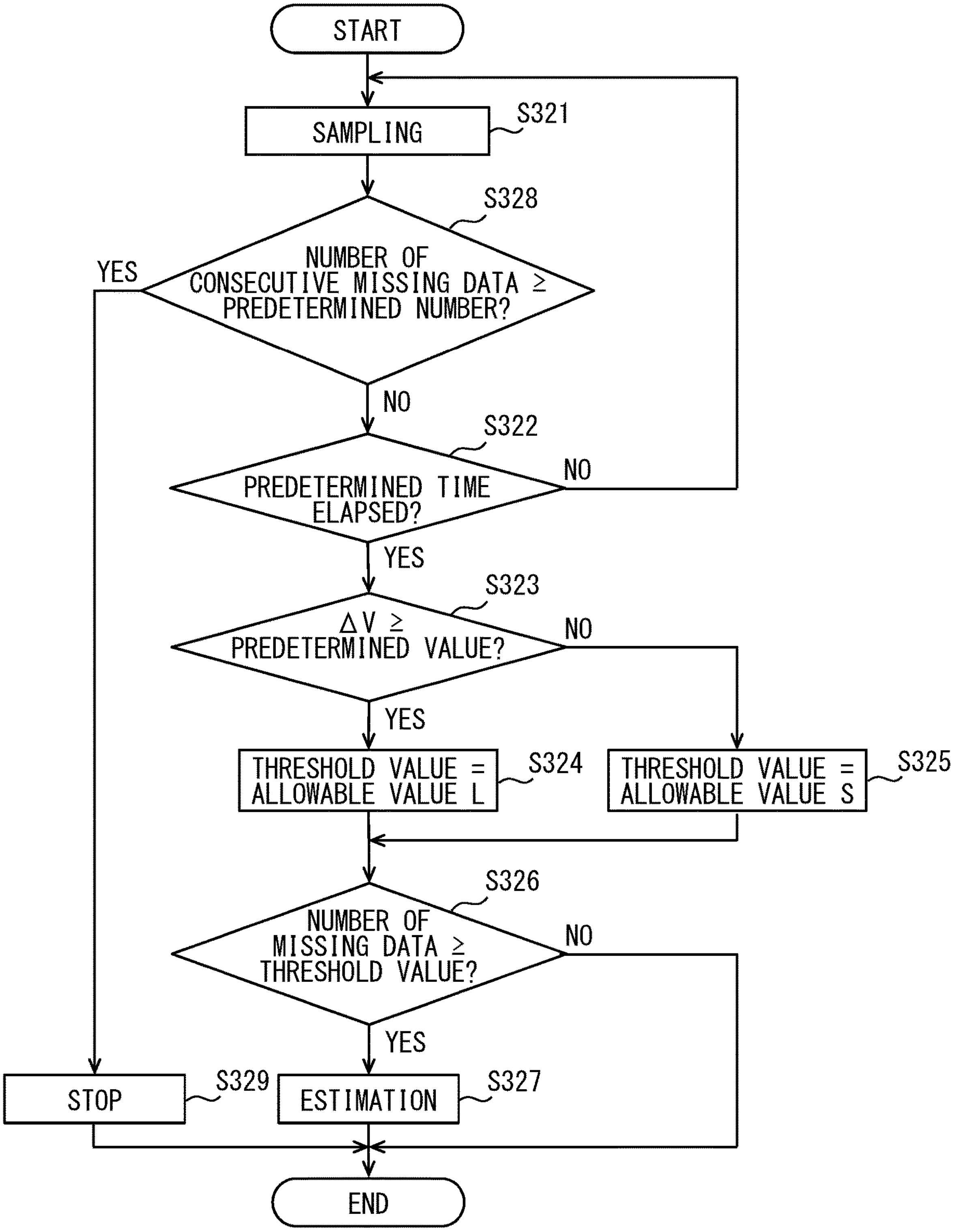
FIG. 16 is a flowchart showing an estimation process executed by a controller in a battery management system according to a fourth embodiment.
Figure 17:
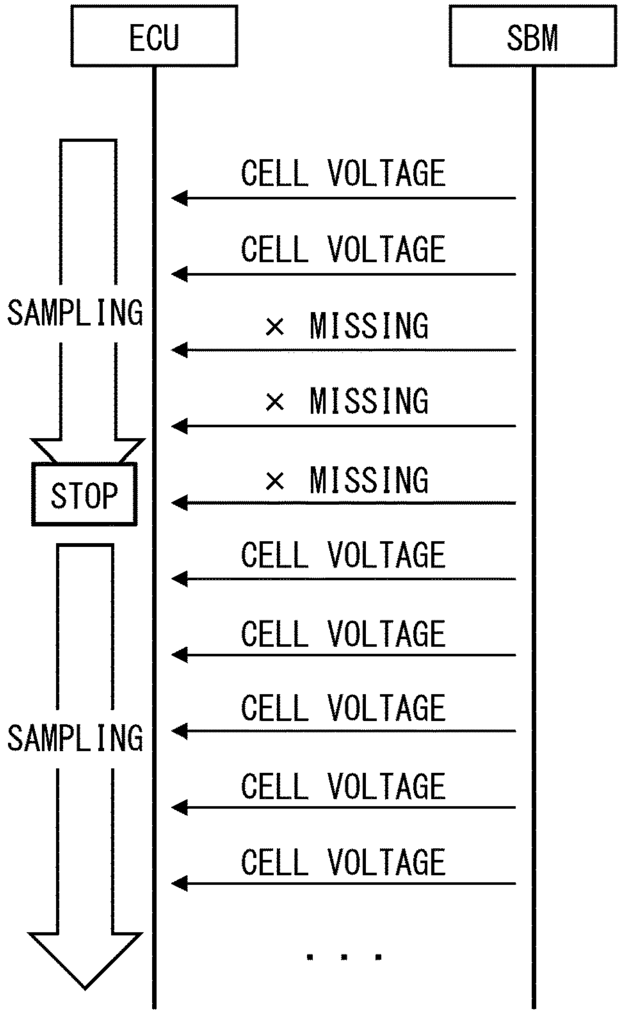
FIG. 17 is a diagram illustrating a communication sequence between a monitoring device and a controller.

FIG. 16 is a flowchart showing an estimation process executed by a controller 40 in a battery management system 60 according to the present embodiment. The process shown in FIG. 16 is based on the process shown in FIG. 14. The difference from the process shown in FIG. 14 is that process of steps S328 and S329 are added. Since the other processes are the same as those in FIG. 14, the description thereof will be omitted below. FIG. 17 is a diagram showing timing of transmitting the cell voltage from the monitoring device 30 to the controller 40.

Before executing the process of step S322, the controller 40 determines whether a predetermined number or more of missing of the cell voltages has occurred successively (step S328). That is, the controller 40 determines whether the number of successive missing of data is the predetermined number or more.

The controller 40 executes the process of step S328 after executing the process of step 321, for example. Instead of this, the process of step S328 may be executed before the process of step S321. In this case, the controller 40 repeats the processes of steps S328, S321, and S322 until a predetermined period elapses.

The predetermined number is set to a value equal to or less than the threshold value. Since the threshold value is variable, a value less than or equal to the minimum value of the threshold value is set as the predetermined number. The minimum value of the predetermined number is 2. In this case, when successive missing of data occurs, the sampling is stopped as will be described later. The predetermined number may be set at 3 or more and not more than the minimum threshold value.

When the number of successive missing of data is equal to or greater than the predetermined number, the controller 40 stops sampling (step 329). Then, the controller 40 ends a series of processes and starts a next estimation process, that is, next sampling. The controller 40 reacquires the cell voltage and the cell current from scratch. As shown in FIG. 17, in the present embodiment, as an example, when the missing of data occurs three times in succession, sampling is stopped and the cell voltage and cell current are reacquired from scratch.

Summary of Fourth Embodiment

In this embodiment, sampling is stopped when the missing of data is successive. As a result, wasted time can be reduced in a configuration in which the estimation process is not executed when the number of missing data exceeds the threshold value.

The configuration described in the present embodiment can be combined with either of the configurations described in the first embodiment, the second embodiment and the third embodiment.

Fifth Embodiment

This embodiment is a modification based on the preceding embodiment, and the description of the preceding embodiment can be incorporated. In this embodiment, a configuration suitable for inspecting whether the assembled battery 20 is reusable will be described.

<Inspection System>

Figure 18:
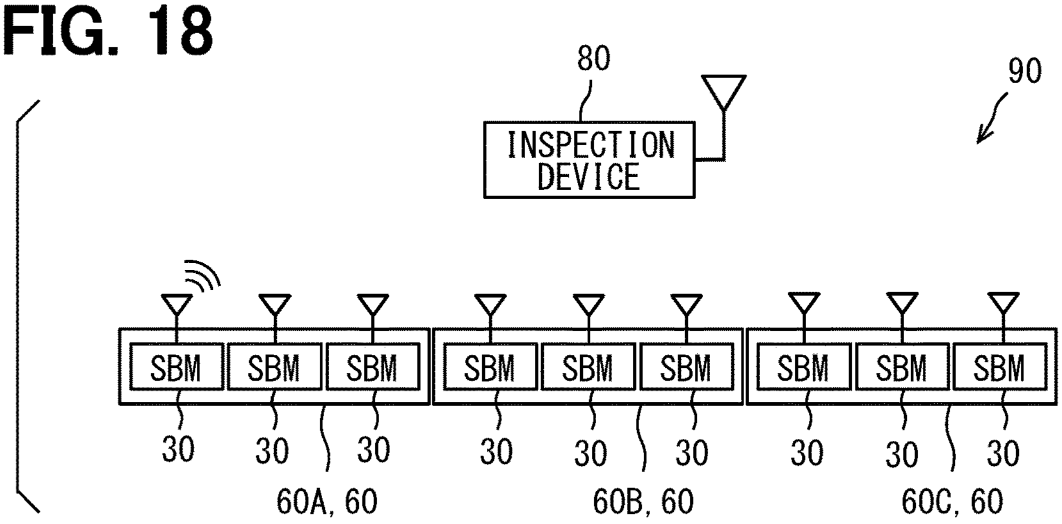
FIG. 18 is a diagram illustrating an inspection system including a battery management system according to a fifth embodiment.

The assembled battery 20 (battery cell 22) of the battery pack 11 is inspected (i.e. diagnosed) and determined whether the assembled battery 20 is reusable by an inspection device 80 while the assembled battery 20 is removed from the vehicle 10. As shown in FIG. 18, the inspection device 80 and the battery management system 60 removed from the vehicle 10 together with the assembled battery 20 establish an inspection system 90. The inspection device 80 inspects the assembled battery 20. The inspection system 90 includes at least one of battery management systems 60 removed from the vehicle 10 and the inspection device 80.

An inspection of the battery cell 22 by the inspection device 80 may be performed individually for the battery management systems 60, but it is efficient to perform the inspection for the multiple battery management systems 60 collectively. In the example shown in FIG. 18, the inspection system 90 includes three battery management systems 60 (60A, 60B, 60C), and the inspection device 80 collectively inspects the battery cells 22 corresponding to the battery management systems 60A, 60B, 60C.

In the inspection system 90, the inspection device 80 wirelessly communicates with each of the monitoring devices 30 and acquires battery monitoring information for inspection. This battery monitoring information includes at least the above-described battery information and the failure diagnosis information.

The inspection device 80 inspects a deterioration state and/or abnormality of the battery cell 22, and determines whether the battery cell 22 is reusable based on the inspection result. The inspection device 80 determines whether the battery cell 22 (i.e. assembled battery 20) is suitable for reuse or recycle. The inspection device 80 may be referred to as an inspection tool, a diagnostic device, of an external device, for example.

The battery management system 60 may be provided with at least the monitoring device 30 and the sensor 70 while the battery management system 60 is removed from the vehicle 10 together with the assembled battery 20. That is, the battery management system 60 may be configured to be capable of transmitting battery monitoring information to the inspection device 80 via wireless communication. Therefore, a configuration that does not include the housing 50 and a configuration that does not include the controller 40 may be used for the battery management system 60. Of course, the battery management system 60 may have the same configuration as when mounted on a vehicle. If the controller 40 is not provided, the inspection device 80 may acquire the cell current from the current sensor.

When the assembled battery 20 is connected to a load (not shown), that is, in a state where the load is energized by the assembled battery 20, the inspection device 80 performs wireless communication with the monitoring device 30, acquires the battery monitoring information, and inspects (i.e. diagnoses) a deterioration state or abnormality of the battery cell 22. Then, based on the inspection result, the inspection device 80 determines whether the battery cell 22 is reusable.

<Inspection Method>

Figure 19:
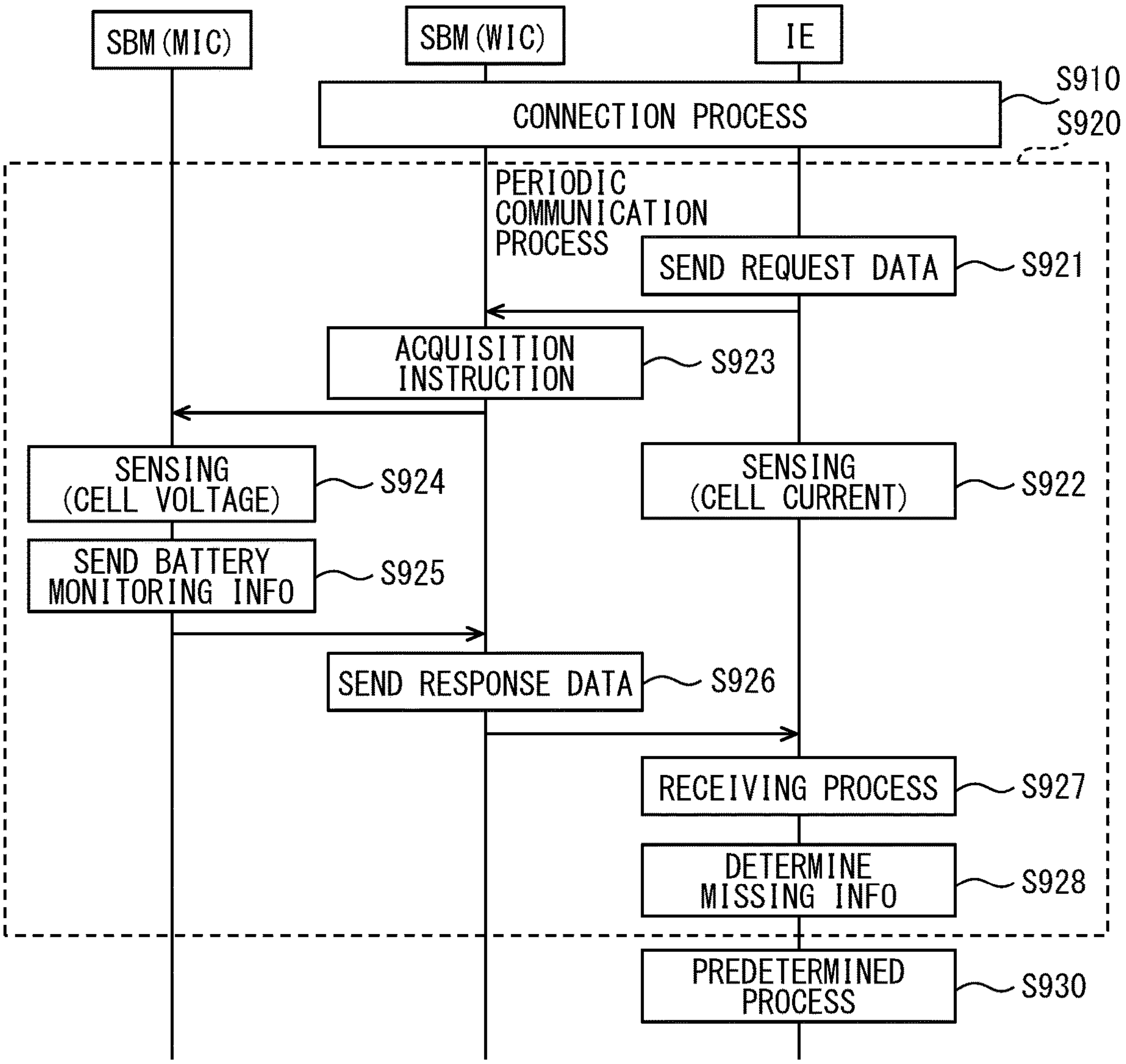
FIG. 19 is a diagram illustrating a communication sequence between a monitoring device and a inspection device.

FIG. 19 illustrates an example of a communication sequence between the monitoring device 30 included in the battery management system 60 of the present embodiment and the inspection device 80. In FIG. 19, the monitoring device 30 is shown as a SBM, the monitoring IC 33 is shown as a MIC, the wireless IC 35 is shown as a WIC, and the inspection device 80 is shown as an IE.

The inspection system 90 performs, for example, star network communication. That is, the inspection device 80 performs wireless communication with each of the monitoring devices 30. Wireless communication between one monitoring device 30 and the inspection device 80 will be described hereinbelow for convenience. The inspection device 80 performs similar processes with all the monitoring devices 30. The monitoring device 30 and the inspection device 80 perform wireless communication in the same procedure as the monitoring device 30 and the controller 40 shown in FIG. 5. Steps shown in FIG. 19 are assigned step numbers such that nine hundred is added to the corresponding step numbers of FIG. 5.

For performing wireless communication, the monitoring device 30 and the inspection device 80 first execute a connection process as shown in FIG. 19 (step S910). In step S910, the monitoring device 30 and the inspection device 80 make a connection of wireless communication. The connection process includes, for example, a connection establishment process. In the connection establishment process, the inspection device 80 executes a scanning operation, and the monitoring device 30 executes an advertising operation.

When the connection process is completed, the inspection device 80 execute a periodic communication process for periodically acquiring the inspection data from the monitoring device 30 (step S920). The monitoring device 30 periodically (cyclically) performs data communication with the inspection device 80. In the periodic communication process, the inspection device 80 transmits request data (step S920) to the monitoring device 30 that has completed the connection process with the inspection device 80. The request data includes, for example, a request for acquisition of battery monitoring information and a request for transmission of the acquired battery monitoring information.

When the inspection device 80 transmits the request data, the inspection device 80 senses the cell current (step S922). The inspection device 80 acquires the cell current from the current sensor by wire. In step S922, the inspection device 80 acquires the value of the cell current at substantially the same timing as the monitoring device 30 senses the cell voltage or the like.

Upon receiving the request data, the wireless IC 35 of the monitoring device 30 transmits a request for acquisition of the battery monitoring information, that is, an acquisition instruction to the monitoring IC 33 (step S923). The wireless IC 35 of the present embodiment transmits the acquisition request to the monitoring IC 33 via the microcontroller 34.

Upon receiving the acquisition request, the monitoring IC 33 executes sensing (step S924). The monitoring IC 33 performs sensing and acquires battery information of each battery cell 22. The battery information includes the cell voltage and the cell temperature. Further, the monitoring IC 33 executes a failure diagnosis of a circuit constituting the monitoring device 30.

Next, the monitoring IC 33 transmits the acquired battery monitoring information to the wireless IC 35 (step S925). In the present embodiment, the monitoring IC 33 transmits battery monitoring information including a malfunction diagnosis result as well as battery information. The monitoring IC 33 transmits the monitoring data to the wireless IC 35 via the microcontroller 34.

When the wireless IC 35 receives the battery monitoring information that the monitoring IC 33 has acquired, the wireless IC 35 transmits transmission data including the battery monitoring information, that is, response data to the inspection device 80 (step S926).

The inspection device 80 executes a reception process at step S927 after the execution of step S922. Next, the inspection device 80 determines whether the battery monitoring information is missing (step S928).

Like the controller 40, the inspection device 80 can adopt the method of determining the missing of data shown in FIGS. 6 and 13. The inspection device 80 determines missing of the battery monitoring information, for example, based on success or failure of acquisition of the response data corresponding to the request data, that is, success or failure of acquisition of the battery monitoring information.

The inspection device 80 sets a cycle in which the inspection device 80 makes a round of the monitoring devices 30 in order to perform wireless communication with each of the monitoring devices 30. That is, the inspection device 80 executes the periodic communication process with each of the monitoring devices 30 in order within one cycle. The inspection device 80 periodically executes the processes of steps S921 to S928 described above with the monitoring device 30 for which the connection has been established according to the preset cycle.

The inspection device 80 executes a predetermined process based on the battery monitoring information (step S930). The inspection device 80 includes, as the predetermined process, a process executed based on, for example, battery monitoring information acquired during a predetermined period. The inspection device 80 may include, as the predetermined process, a process executed every time the battery monitoring information is acquired.

The inspection device 80 inspects the deterioration state of the battery cell 22 by estimating the internal resistance or the SOH of the battery cell 22 based on the cell voltage and the cell current acquired during the predetermined period. The inspection device 80 inspects abnormality of the battery cell 22 or abnormality of the monitoring device 30 based on, for example, the failure diagnosis information. When the assembled batteries 20 corresponding to the multiple battery management systems 60 are collectively inspected, the assembled batteries 20 (i.e. battery stacks 21) are connected in series, for example.

Summary of Fifth Embodiment

In the present embodiment, the inspection device 80 determines whether missing of the battery monitoring information has occurred based on a correlation between the battery monitoring information acquired from the monitoring device 30 via wireless communication and relationship information held by the inspection device 80 which is the information related to the battery monitoring information. When the battery monitoring information corresponding to the relationship information cannot be acquired, the inspection device 80 determines that missing of the battery monitoring information has occurred. As a result, missing of the battery monitoring information can be detected. The inspection device 80 can execute the predetermined process in consideration of the missing of the battery monitoring information. An example of the relationship information is request data of the battery monitoring information, and another example is the cell current acquired at almost the same timing as the cell voltage.

The inspection device 80 can execute the same process as the process executed by the controller 40 in the configuration shown in each preceding embodiment. The inspection device 80 may perform the same processes as those shown in FIG. 8, for example. For example, when the number of acquired cell voltages in a predetermined period is less than the threshold value, the inspection device 80 complements the missing cell voltage and executes a predetermined process such as internal resistance estimation. According to this, the predetermined process can be executed even if missing of battery monitoring information occurs. That is, the frequency of predetermined process can be improved. Therefore, an efficiency in work of reusability inspection can be improved.

The inspection device 80 may perform the same processes as those shown in FIG. 14, for example. The inspection device 80 sets the threshold value for determining whether the estimation process can be executed based on the acquired parameters related to the state of the battery cell 22. For example, the threshold value is set based on the voltage width ΔV calculated from the cell voltages. A large value is set as the threshold value when the voltage width ΔV is large, and a small value is set as the threshold value when the voltage width ΔV is small. In this way, the controller 40 is capable of setting a value as the threshold value in accordance with the state of the battery cell 22. Accordingly, the frequency of predetermined process can be improved.

In the reusability inspection, a large number of assembled batteries 20 are inspected at one time. Therefore, the number of monitoring devices 30 that wirelessly communicate with the inspection device 80 is also large. The communication environment is considered to deteriorate due to activation of the large number of monitoring devices 30. That is, it is expected that communication data will be missed easily. On the other hand, by performing the same processes as in FIGS. 8 and 14, the inspection device 80 can improve the frequency of inspecting the deteriorated state of the battery cell 22. The inspection efficiency can be improved in an environment where communication data is likely to be missed.

The inspection device 80 may acquire manufacturing history information from the monitoring device 30 via the periodic communication process. The manufacturing history information is, for example, a manufacturing ID (serial number) and a manufacturing date and time. In this case, the inspection device 80 may inspect (i.e. determine) the deterioration state based on the manufacturing history information. The inspection device 80 inspects (i.e. determines) the deterioration state of the battery cell 22 based on, for example, the acquired manufacturing history information. The inspection device 80 inspects the deterioration state of the battery cell 22 based on, for example, an elapsed time from the manufacturing date. The inspection device 80 may acquire inspection information including the battery monitoring information and/or the manufacturing history information and inspect the deterioration state or abnormality of the battery cell 22 based on the inspection information.

A situation where the assembled battery 20 is inspected by the inspection device 80 while the assembled battery 20 and the battery management system 60 are removed from a mobile body is not limited to an inspection of the reusability of the assembled battery 20. For example, the situation may be inspection of the battery pack 11 at the time of manufacture, or an inspection at a repair shop.

Other Embodiments

The disclosure in this specification, the drawings, and the like is not limited to the exemplified embodiments. The disclosure encompasses the illustrated embodiments and variations thereof by those skilled in the art. For example, the disclosure is not limited to the parts and/or combinations of elements shown in the embodiments. The disclosure is feasible by various combinations. The disclosure can have additional portions that can be added to the embodiments. The present disclosure encompasses the embodiments where some components and/or elements are omitted. The present disclosure encompasses replacement or combination of components and/or elements between one embodiment and another. The disclosed technical scope is not limited to the description of the embodiment. The several technical scopes disclosed are indicated by the description of the claims, and should be further understood to include meanings equivalent to the description of the claims and all modifications within the scope.

The disclosure in the specification, drawings and the like is not limited by the description of the claims. The disclosures in the specification, the drawings, and the like encompass the technical ideas described in the claims, and further extend to a wider variety of technical ideas than those in the claims. Hence, various technical ideas can be extracted from the disclosure of the specification, the drawings, and the like without being bound by the description of the claims.

When an element or layer is referred to as being "on," "coupled," "connected," or "combined," it may be directly on, coupled, connected, or combined to the other element or layer, or further, intervening elements or layers may be present. In contrast, when an element is referred to as being "directly on," "directly coupled to," "directly connected to," or "directly combined with" another element or layer, there are no intervening elements or layers present. Other terms used to describe the relationship between elements should be interpreted in a similar manner (e.g., "between" and "directly between," "adjacent" and "directly adjacent," and the like). As used herein, the term "and/or" includes any combination and all combinations relating to one or more of the related listed items. For example, the term A and/or B includes only A, only B, or both A and B.

Spatially relative terms such as "inner," "outer," "back," "below," "low," "above," and "high" are utilized herein to facilitate description of one element or feature's relationship to another element (s) or feature (s) as illustrated. Spatial relative terms can be intended to include different orientations of a device in use or operation, in addition to the orientations depicted in the drawings. For example, when a device in a drawing is turned over, elements described as "below" or "directly below" other elements or features are oriented "above" the other elements or features. Therefore, the term "below" can include both above and below. The device may be oriented in the other direction (rotated 90 degrees or in any other direction) and the spatially relative terms used herein are interpreted accordingly.

The device, the system, and the method thereof described in the present disclosure may be implemented by a special purpose computer forming a processor programmed to execute one or more particular functions embodied in computer programs. Alternatively, the apparatuses and methods described in this application may be fully implemented by special purpose hardware logic circuits. Further alternatively, the apparatuses and methods described in this application may be implemented by a special purpose computer created by a combination of a processor executing computer programs coupled with hardware logic circuits. The computer program may be stored in a computer-readable non-transition tangible recording medium as an instruction executed by a computer.

Figure 20:
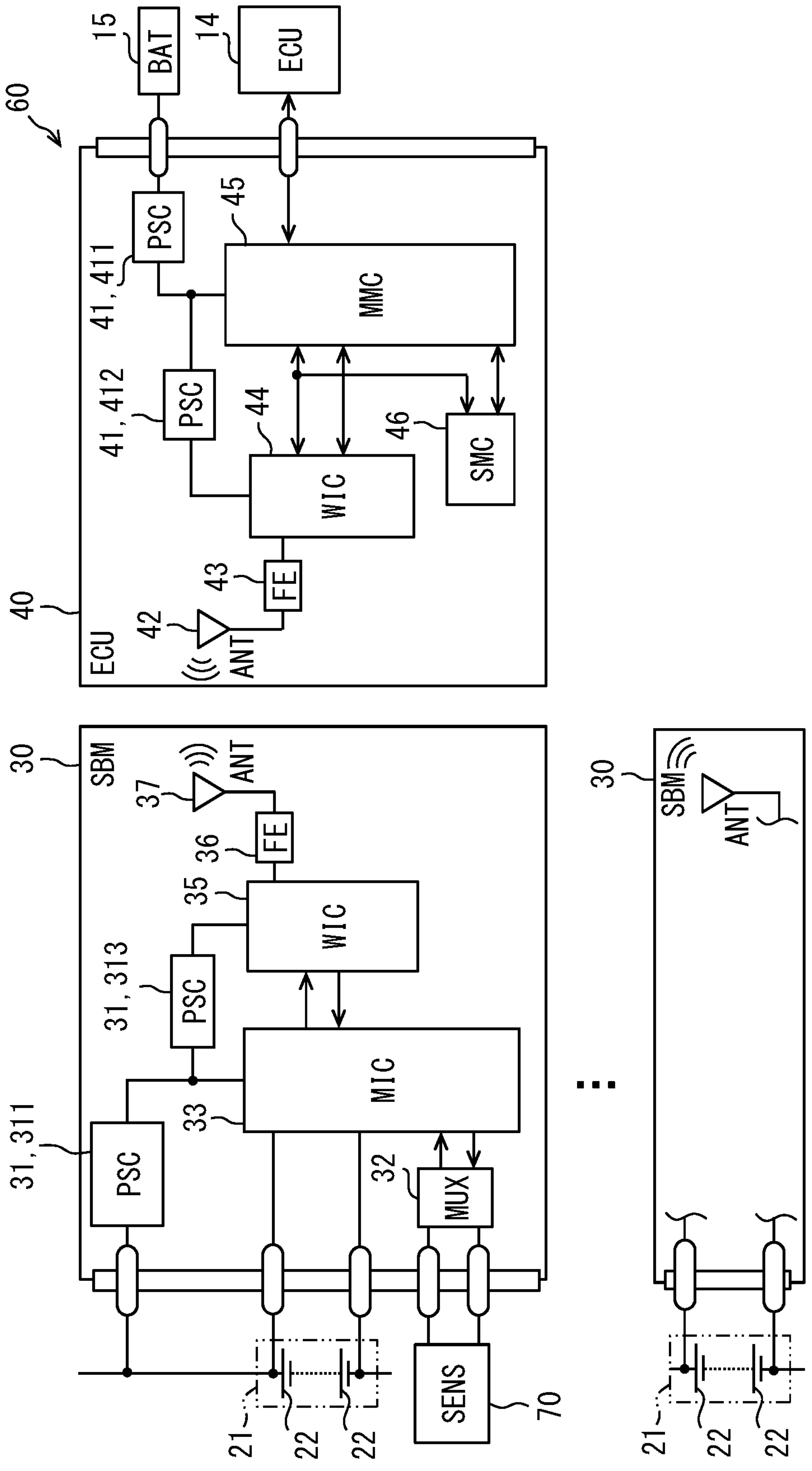
FIG. 20 is a block diagram illustrating a battery management system according to a modification.

For example, an example in which the monitoring device 30 includes the microcontroller 34 has been described, but the present disclosure is not limited thereto. As shown in FIG. 20, a battery management system 60 in which the monitoring device 30 does not include the microcontroller 34 may be adopted. FIG. 20 corresponds to FIG. 4. In this configuration, the wireless IC 35 transmits and receives data to and from the monitoring IC 33. The wireless IC 35 may execute the sensing by the monitoring IC 33 and the schedule control of the self-diagnosis, or the main microcontroller 45 of the controller 40 may execute the sensing and the schedule control.

An example of arranging the monitoring device 30 for each of the respective battery stacks 21 has been shown, but the present disclosure is not limited thereto. For example, one monitoring device 30 may be arranged for multiple battery stacks 21. Multiple monitoring devices 30 may be arranged for one battery stack 21.

While the example in which the battery pack 11 includes one controller 40 has been described, the present invention is not limited thereto. The battery pack 11 may include multiple controllers 40.

While the example in which the controller 40 includes one wireless IC 44 has been described, the present invention is not limited thereto. The controller 40 may include multiple wireless ICs 44. Each of the multiple wireless ICs 44 may wirelessly communicate with different monitoring devices 30.

An example has been described in which the monitoring device 30 includes one monitoring IC 33, but the present disclosure is not limited thereto. The monitoring device 30 may include multiple monitoring ICs 33. In this case, the wireless IC 35 may be provided for each of the monitoring ICs 33, or one wireless IC 35 may be provided for the multiple monitoring ICs 33.

Although an example in which the controller 40 is arranged in the housing 50 is shown, the present invention is not limited to this. The controller 40 may be arranged outside the housing 50.

The arrangement and number of the battery stacks 21 and the battery cells 22 constituting the assembled battery 20 are not limited to the above example. In the battery pack 11, the arrangement of the monitoring device 30 and/or the controller 40 is not limited to the above example.

While the present disclosure has been described with reference to embodiments thereof, it is to be understood that the disclosure is not limited to the embodiments and constructions. To the contrary, the present disclosure is intended to cover various modification and equivalent arrangements. In addition, while the various elements are shown in various combinations and configurations, which are exemplary, other combinations and configurations, including more, less or only a single element, are also within the spirit and scope of the present disclosure.

What is claimed is:

1. A battery management system comprising:

at least one monitoring device configured to monitor a battery and acquire battery monitoring information that includes information indicating a state of the battery; and a controller configured to perform wireless communication with the at least one monitoring device and execute a predetermined process based on the battery monitoring information, wherein the controller is configured to transmit a request for battery monitoring information to the at least one monitoring device, the at least one monitoring device is configured to transmit the battery monitoring information to the controller in response to the request, and the controller is configured to determine whether missing of the battery monitoring information has occurred based on a correlation between the battery monitoring information acquired from the at least one monitoring device via wireless communication and relationship information held by the controller related to the battery monitoring information, the controller is configured to:

acquire the battery monitoring information from the at least one monitoring device via wireless communication;

acquire wired information which is information indicating the state of the battery via wired communication without the at least one monitoring device; and execute the predetermined process based on the acquired battery monitoring information and the wired information, the relationship information is the wired information, the controller determines that the missing of the battery monitoring information has occurred when the battery monitoring information corresponding to the wired information cannot be acquired.

2. The battery management system according to claim 1, wherein the relationship information is information about the request, and the controller is configured to determine that the missing of the battery monitoring information has occurred when the battery monitoring information corresponding to the request cannot be acquired.

3. The battery management system according to claim 2, wherein the controller is configured to:

acquire the battery monitoring information from the at least one monitoring device via wireless communication;

acquire wired information which is information indicating the state of the battery via wired communication without the at least one monitoring device; and execute the predetermined process based on the battery monitoring information and the wired information.

4. The battery management system according to claim 3, wherein the at least one monitoring device is configured to acquire the battery monitoring information including at least a cell voltage which is a voltage of each of battery cells forming the battery, and the controller is configured to:

acquire the battery monitoring information including the cell voltage from the at least one monitoring device;

acquire a cell current flowing through the battery cell as the wired information; and execute an estimation process as the predetermined process and estimate an internal resistance and/or an open circuit voltage of the battery cell based on the cell current and the battery monitoring information including the cell voltage in the estimation process.

5. The battery management system according to claim 4, wherein the controller is configured to execute the estimation process when the number of acquired cell voltages during a predetermined period is equal to or greater than a predetermined threshold value.

6. The battery management system according to claim 5, wherein the controller is configured to complement a missing cell voltage and execute the estimation process when the number of acquired cell voltages is less than the threshold value.

7. The battery management system according to claim 6, wherein the controller is configured to complement a missing cell voltage by using a cell voltage obtained from the at least one monitoring device corresponding to the missing cell voltage and acquired immediately before and/or immediately after timing of occurrence of the missing.

8. The battery management system according to claim 6, wherein the at least one monitoring device is one of monitoring devices, and the controller is configured to complement the missing cell voltage by using a cell voltage obtained from another monitoring device different from a monitoring device corresponding to the missing cell voltage and acquired in the same cycle as the missing cell voltage acquired.

9. The battery management system according to claim 4, wherein the controller is configured to execute the estimation process when the number of missing cell voltages during a predetermined period is equal to or less than a predetermined number.

10. The battery management system according to claim 9, wherein the controller is configured to set the predetermined number based on acquired parameters related to the state of the battery.

11. The battery management system according to claim 9, wherein the controller is configured to stop sampling and reacquire the battery monitoring information including the cell voltage and the cell current when a predetermined number of missing of cell voltages has occurred successively.

12. The battery management system according to claim 1, for being mounted on a mobile body, wherein the at least one monitoring device and the battery are removed from the mobile body, the battery management system further comprising an inspection device configured to an inspection of the battery, wherein the inspection device is configured to:

transmit a request for inspection information including battery monitoring information and/or manufacturing history information to the at least one monitoring device;

receive the inspection information that is transmitted by the at least one monitoring device in response to the request;

execute the inspection based on the received inspection information; and determine whether missing of the inspection information has occurred based on a correlation between the inspection information acquired from the at least one monitoring device via wireless communication and relationship information held by the inspection device related to the inspection information.

13. A method for managing a battery by performing wireless communication between at least one monitoring device and a controller, the at least one monitoring device being configured to monitor the battery and acquire battery monitoring information that includes information indicating a state of the battery, the controller being configured to execute a predetermined process based on the battery monitoring information, the method comprising:

transmitting by the controller a request for battery monitoring information to the at least one monitoring device;

transmitting by the at least one monitoring device the battery monitoring information to the controller in response to the request; and determining by the controller whether missing of the battery monitoring information has occurred based on a correlation between the battery monitoring information acquired from the at least one monitoring device via wireless communication and relationship information held by the controller related to the battery monitoring information;

acquiring by the controller the battery monitoring information from the at least one monitoring device via wireless communication;

acquiring by the controller wired information which is information indicating the state of the battery via wired communication without the at least one monitoring device, wherein the relationship information is the wired information;

executing by the controller the predetermined process based on the acquired battery monitoring information and the wired information; and determining by the controller that the missing of the battery monitoring information has occurred when the battery monitoring information corresponding to the wired information cannot be acquired.

14. A battery management system comprising:

at least one monitoring device configured to monitor a battery and acquire battery monitoring information that includes information indicating a state of the battery; and a controller configured to perform wireless communication with the at least one monitoring device and execute a predetermined process based on the battery monitoring information, wherein the controller is configured to transmit a request for battery monitoring information to the at least one monitoring device, the at least one monitoring device is configured to transmit the battery monitoring information to the controller in response to the request, the controller is configured to determine whether missing of the battery monitoring information has occurred based on a correlation between the battery monitoring information acquired from the at least one monitoring device via wireless communication and relationship information held by the controller related to the battery monitoring information, the at least one monitoring device is configured to acquire the battery monitoring information including at least a cell voltage which is a voltage of each of battery cells forming the battery, and the controller is configured to:

acquire the battery monitoring information including the cell voltage from the at least one monitoring device via wireless communication;

acquire wired information which is information indicating the state of the battery via wired communication without the at least one monitoring device, wherein the wired information includes a cell current flowing through the battery cell; and execute an estimation process as the predetermined process based on the battery monitoring information and the wired information and estimate an internal resistance and/or an open circuit voltage of the battery cell based on the cell current and the battery monitoring information including the cell voltage in the estimation process.

15. A method for managing a battery by performing wireless communication between at least one monitoring device and a controller, the at least one monitoring device being configured to monitor the battery and acquire battery monitoring information that includes information indicating a state of the battery, the controller being configured to execute a predetermined process based on the battery monitoring information, the method comprising:

transmitting by the controller a request for battery monitoring information to the at least one monitoring device;

transmitting by the at least one monitoring device the battery monitoring information to the controller in response to the request; and determining by the controller whether missing of the battery monitoring information has occurred based on a correlation between the battery monitoring information acquired from the at least one monitoring device via wireless communication and relationship information held by the controller related to the battery monitoring information;

acquiring by the at least one monitoring device the battery monitoring information including at least a cell voltage which is a voltage of each of battery cells forming the battery;

acquiring by the controller the battery monitoring information including the cell voltage from the at least one monitoring device via wireless communication;

acquiring by the controller wired information which is information indicating the state of the battery via wired communication without the at least one monitoring device, wherein the wired information includes a cell current flowing through the battery cell; and executing an estimation process as the predetermined process based on the battery monitoring information and the wired information and estimating an internal resistance and/or an open circuit voltage of the battery cell based on the cell current and the battery monitoring information including the cell voltage in the estimation process.

* * * * *